United States Patent
Yamazaki et al.

(10) Patent No.: US 9,905,589 B2
(45) Date of Patent: Feb. 27, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Masakatsu Ohno, Utsunomiya (JP); Hiroki Adachi, Tochigi (JP); Satoru Idojiri, Tochigi (JP); Koichi Takeshima, Sano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/100,476

(22) PCT Filed: Nov. 26, 2014

(86) PCT No.: PCT/IB2014/066346
§ 371 (c)(1),
(2) Date: May 31, 2016

(87) PCT Pub. No.: WO2015/083042
PCT Pub. Date: Jun. 11, 2015

(65) Prior Publication Data
US 2016/0300865 A1    Oct. 13, 2016

(30) Foreign Application Priority Data
Dec. 3, 2013 (JP) ................................. 2013-250623

(51) Int. Cl.
*H01L 27/00* (2006.01)
*H01L 27/12* (2006.01)
(Continued)

(52) U.S. Cl.
CPC ...... *H01L 27/1266* (2013.01); *H01L 21/6835* (2013.01); *H01L 27/1222* (2013.01);
(Continued)

(58) Field of Classification Search
CPC .................................................... H01L 27/1266
See application file for complete search history.

(56) References Cited

U.S. PATENT DOCUMENTS

| | | |
|---|---|---|
| 5,821,138 A | 10/1998 | Yamazaki et al. |
| 6,127,199 A | 10/2000 | Inoue et al. |

(Continued)

FOREIGN PATENT DOCUMENTS

| | | |
|---|---|---|
| CN | 001472772 A | 2/2004 |
| CN | 101043026 A | 9/2007 |

(Continued)

OTHER PUBLICATIONS

International Search Report (Application No. PCT/IB2014/066346) dated Mar. 31, 2015.
(Continued)

*Primary Examiner* — William Harriston
(74) *Attorney, Agent, or Firm* — Robinson Intellectual Property Law Office; Eric J. Robinson

(57) ABSTRACT

An object is to provide a novel separation method or a novel manufacturing method of a device. In the case where a bond of M-O—W (M is a given element) is divided by application of physical force, a liquid is absorbed into the gap, whereby the bond becomes bonds of M-OH HO—W with a longer bond distance and the detachment can be promoted accordingly. In the detachment, a roller such as a drum roller can be used. Part of the roller surface may have adhesiveness. For example, an adhesive tape or the like may be put on part (Continued)

of the roller surface. By rotating the roller, the layer to be separated is wound and detached from the substrate having an insulating surface.

16 Claims, 21 Drawing Sheets

(51) Int. Cl.
  *H01L 21/683* (2006.01)
  *H01L 29/786* (2006.01)
  *H01L 51/00* (2006.01)
  *H01L 27/32* (2006.01)

(52) U.S. Cl.
  CPC .... *H01L 27/1285* (2013.01); *H01L 29/78648* (2013.01); *H01L 29/78675* (2013.01); *H01L 27/3244* (2013.01); *H01L 51/003* (2013.01); *H01L 2221/6835* (2013.01)

(56) References Cited

U.S. PATENT DOCUMENTS

| | | | |
|---|---|---|---|
| 6,258,666 B1 * | 7/2001 | Mizutani | C23C 16/01 156/241 |
| 6,372,608 B1 | 4/2002 | Shimoda et al. | |
| 6,645,830 B2 | 11/2003 | Shimoda et al. | |
| 6,818,530 B2 | 11/2004 | Shimoda et al. | |
| 7,094,665 B2 | 8/2006 | Shimoda et al. | |
| 7,122,445 B2 | 10/2006 | Takayama et al. | |
| 7,285,476 B2 | 10/2007 | Shimoda et al. | |
| 7,375,006 B2 | 5/2008 | Takayama et al. | |
| RE40,601 E | 12/2008 | Inoue et al. | |
| 7,468,308 B2 | 12/2008 | Shimoda | |
| 7,666,719 B2 | 2/2010 | Takayama et al. | |
| 8,043,936 B2 | 10/2011 | Eguchi et al. | |
| 8,048,770 B2 | 11/2011 | Eguchi et al. | |
| 8,048,777 B2 | 11/2011 | Eguchi et al. | |
| 8,137,417 B2 | 3/2012 | Eguchi et al. | |
| 8,278,739 B2 | 10/2012 | Moriwaka | |
| 8,367,440 B2 | 2/2013 | Takayama et al. | |
| 8,415,208 B2 | 4/2013 | Takayama et al. | |
| 9,054,141 B2 | 6/2015 | Eguchi et al. | |
| 2003/0032210 A1 * | 2/2003 | Takayama | H01L 21/76251 438/30 |
| 2004/0087110 A1 | 5/2004 | Takayama et al. | |
| 2007/0032042 A1 | 2/2007 | Takayama et al. | |
| 2007/0222038 A1 | 9/2007 | Moriwaka | |
| 2008/0132033 A1 | 6/2008 | Eguchi et al. | |
| 2008/0206959 A1 | 8/2008 | Takayama et al. | |
| 2009/0017567 A1 | 1/2009 | Eguchi et al. | |
| 2009/0017599 A1 | 1/2009 | Eguchi et al. | |
| 2009/0023251 A1 | 1/2009 | Eguchi et al. | |
| 2012/0045861 A1 | 2/2012 | Eguchi et al. | |
| 2012/0168066 A1 | 7/2012 | Eguchi et al. | |
| 2013/0214324 A1 | 8/2013 | Takayama et al. | |
| 2015/0017751 A1 | 1/2015 | Eguchi et al. | |
| 2015/0123106 A1 | 5/2015 | Yasumoto et al. | |
| 2015/0151531 A1 | 6/2015 | Ohno et al. | |

FOREIGN PATENT DOCUMENTS

| | | |
|---|---|---|
| CN | 101154562 A | 4/2008 |
| CN | 101399177 A | 4/2009 |
| CN | 101399178 A | 4/2009 |
| EP | 1383165 A | 1/2004 |
| JP | 08-250745 A | 9/1996 |
| JP | 08-288522 A | 11/1996 |
| JP | 2002-151524 A | 5/2002 |
| JP | 2003-174153 A | 6/2003 |
| JP | 2004-056143 A | 2/2004 |
| JP | 2005-033219 A | 2/2005 |
| JP | 2007-288173 A | 11/2007 |
| JP | 2008-109123 A | 5/2008 |
| JP | 2009-004810 A | 1/2009 |
| JP | 2009-164649 A | 7/2009 |
| JP | 2009-164650 A | 7/2009 |
| JP | 2009-278124 A | 11/2009 |
| JP | 2012-089859 A | 5/2012 |
| JP | 2012-182503 A | 9/2012 |
| JP | 2013-254989 A | 12/2013 |
| KR | 2004-0010186 A | 1/2004 |
| KR | 2007-0095195 A | 9/2007 |
| KR | 2011-0039427 A | 4/2011 |

OTHER PUBLICATIONS

Written Opinion (Application No. PCT/IB2014/066346) dated Mar. 31, 2015.

* cited by examiner

FIG. 6A1
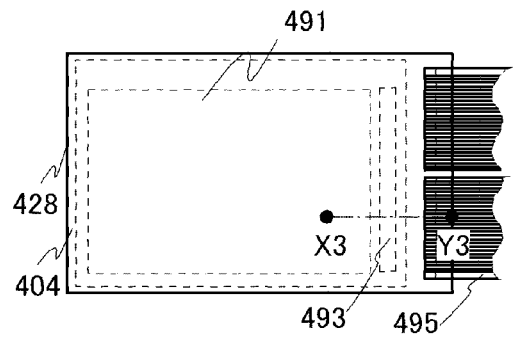
FIG. 6A2
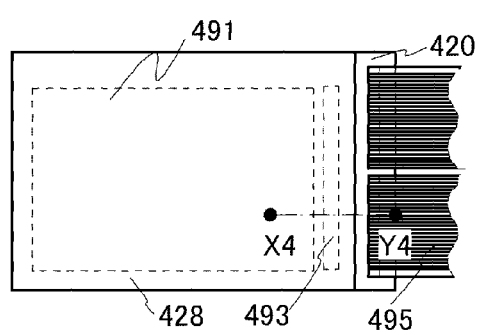
FIG. 6B
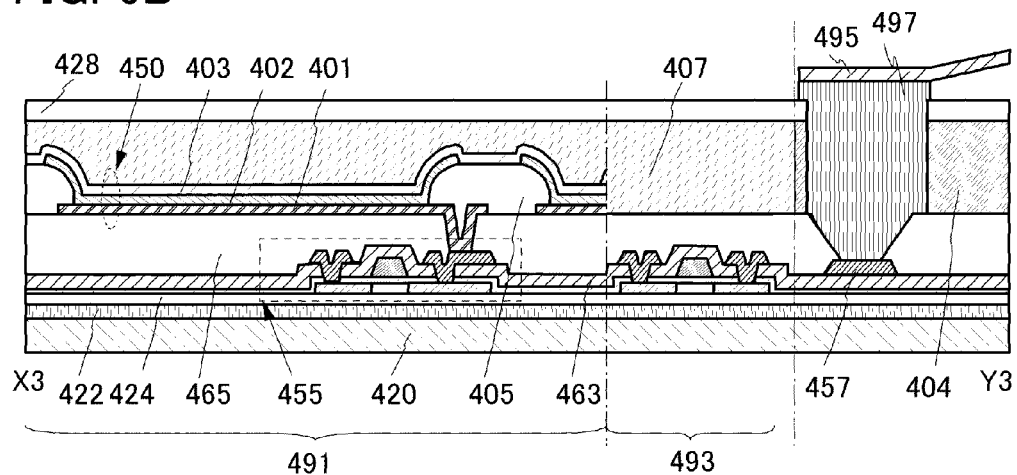
FIG. 6C
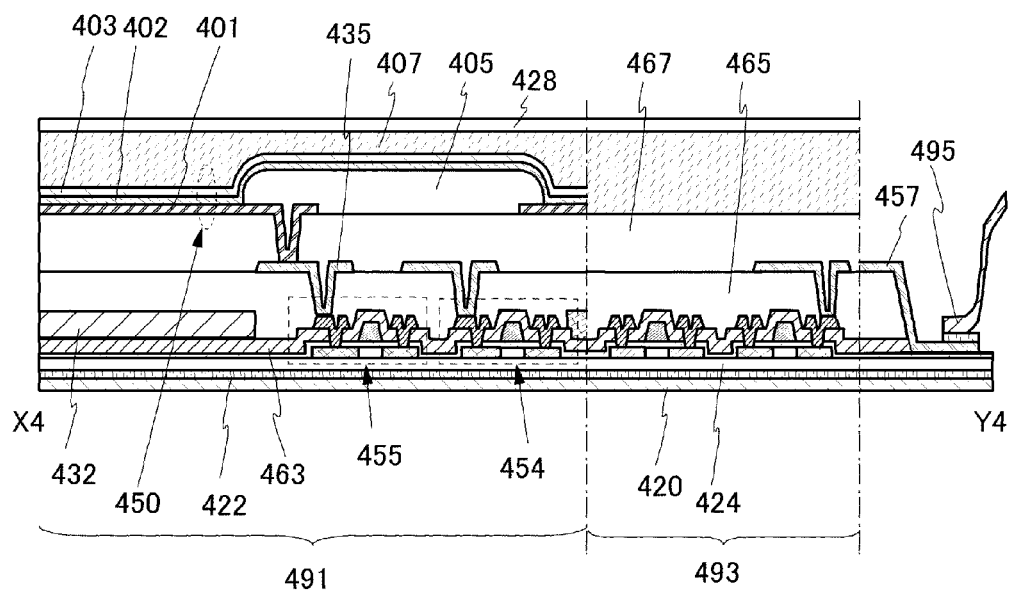

FIG. 8A1
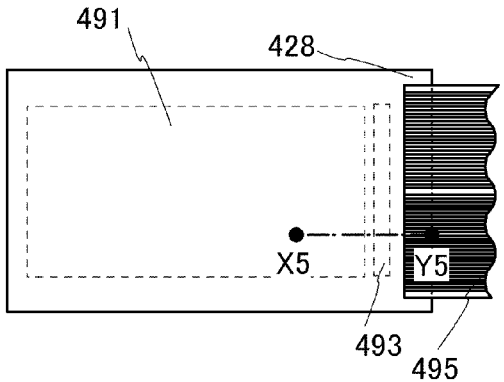
FIG. 8A2
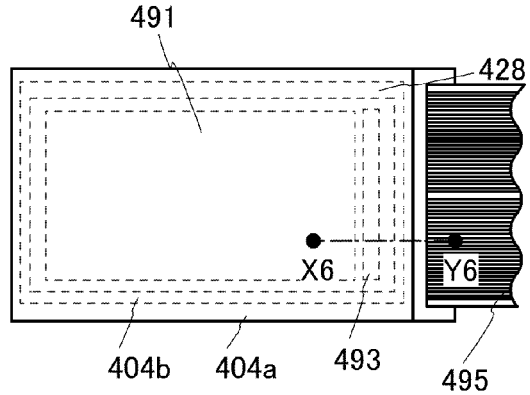
FIG. 8B
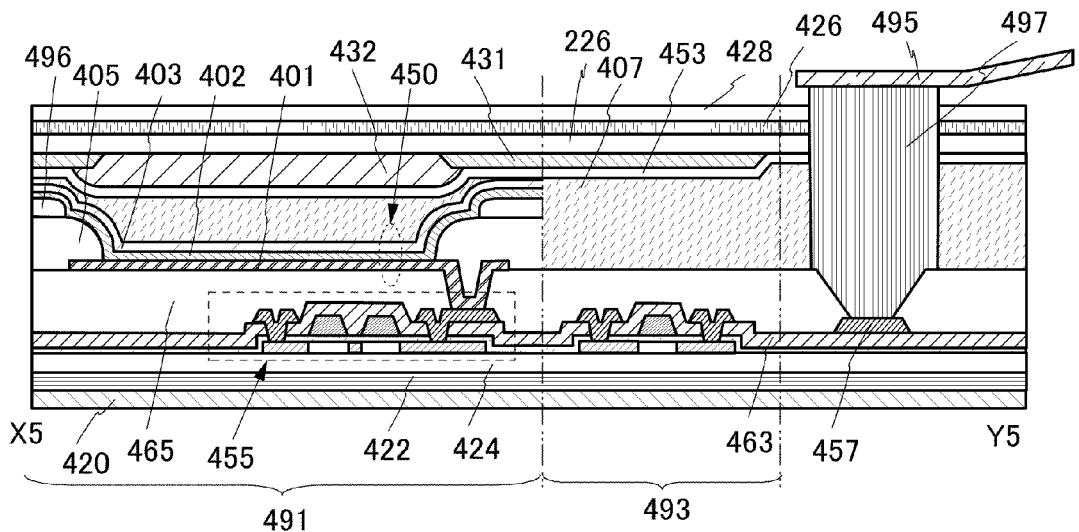
FIG. 8C
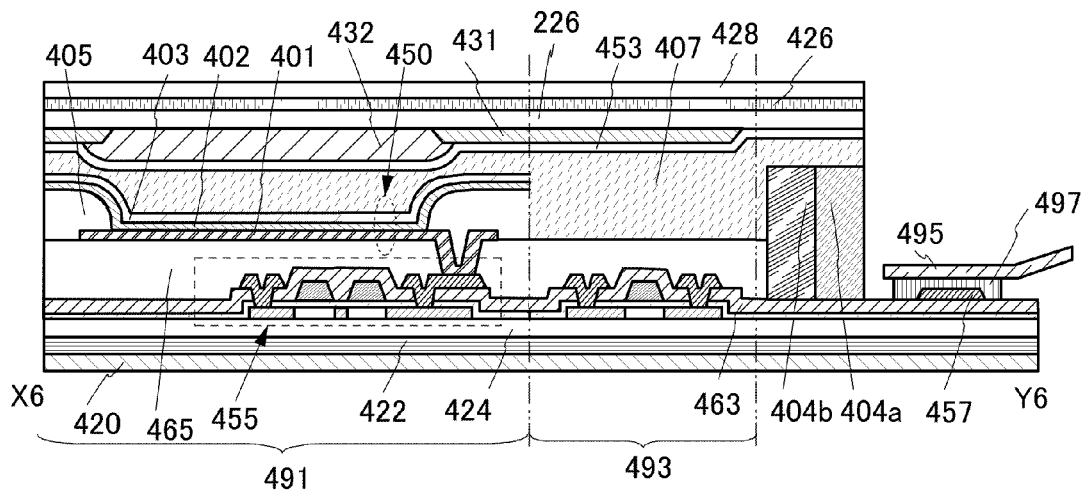

FIG. 17A
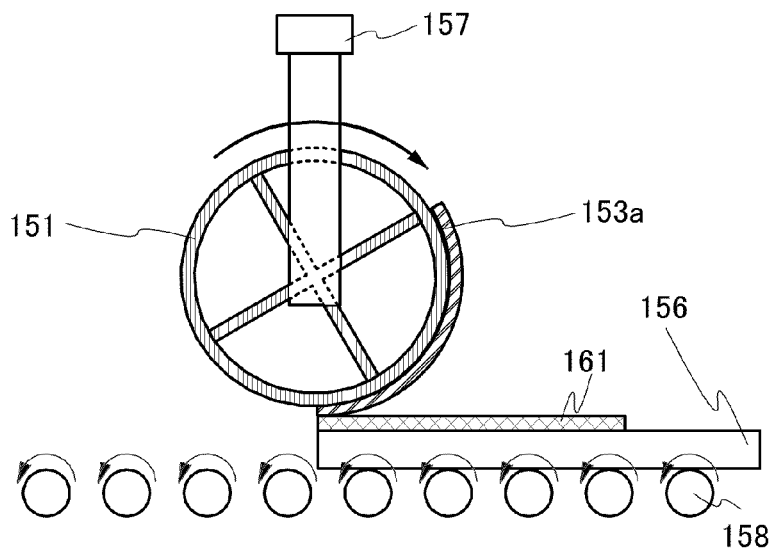
FIG. 17B
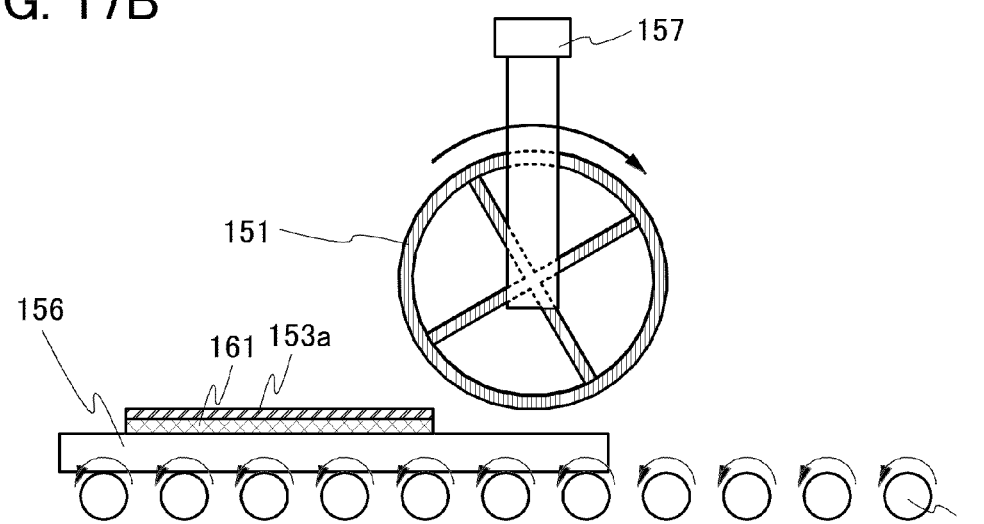
FIG. 17C  FIG. 17D  FIG. 17E
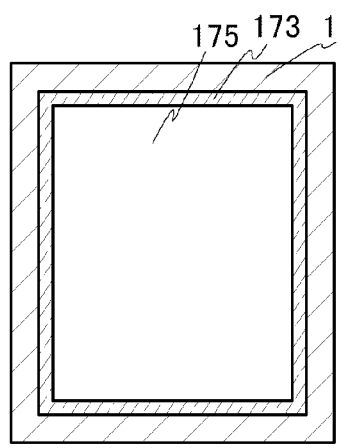 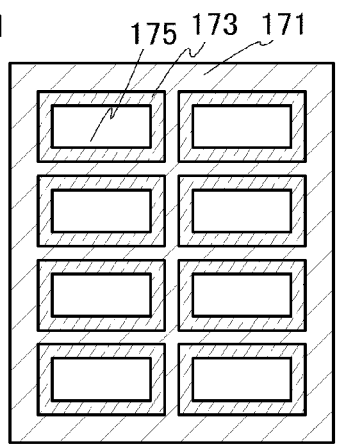 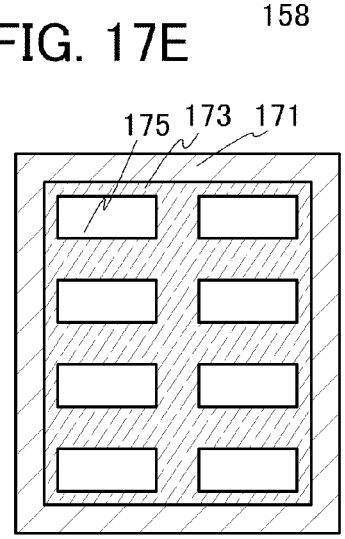

FIG. 18A-1
FIG. 18A-2
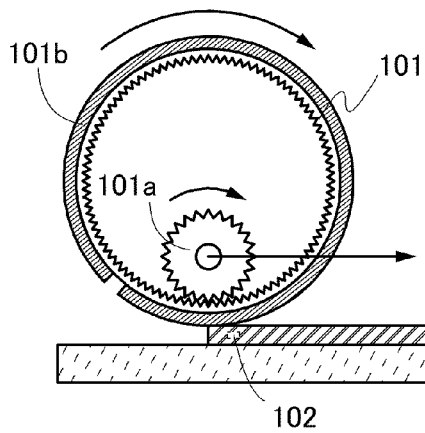
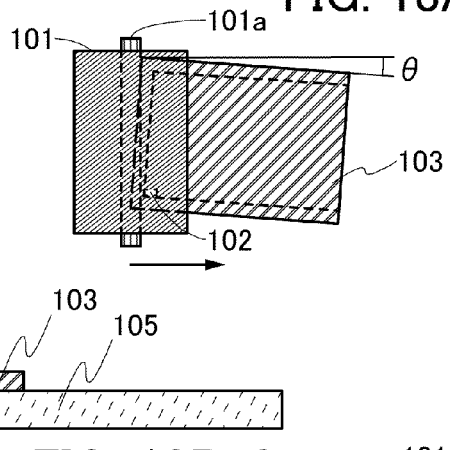
FIG. 18B-1
FIG. 18B-2
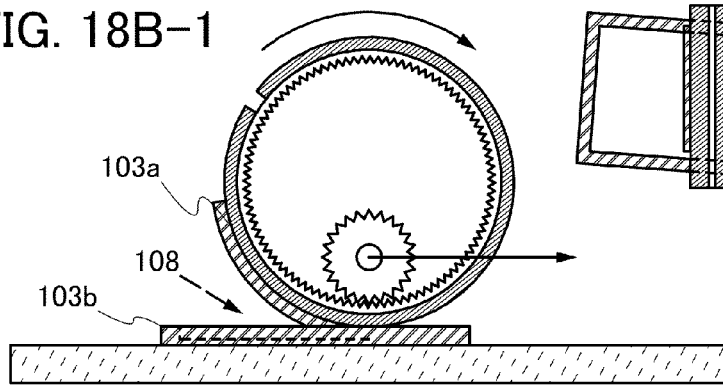
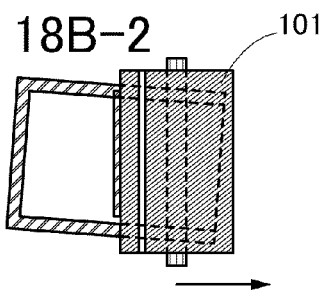
FIG. 18C-1
FIG. 18C-2
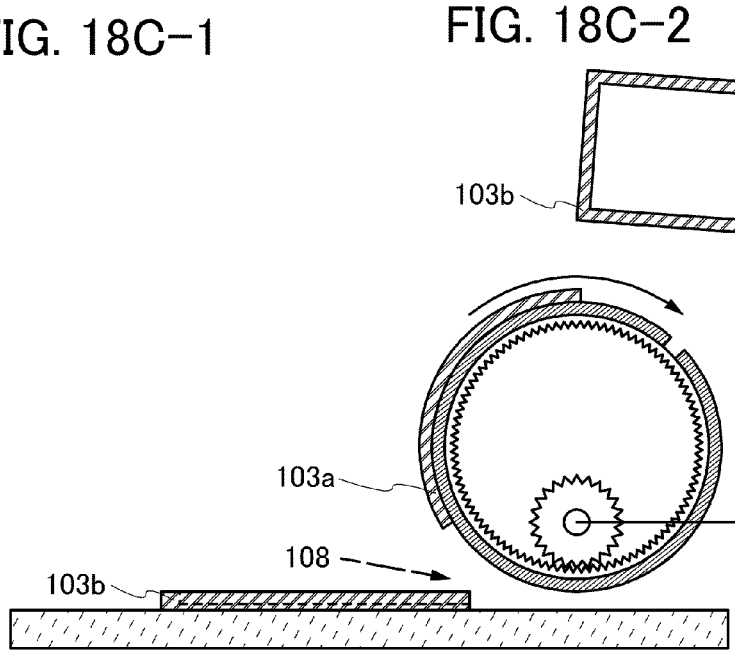
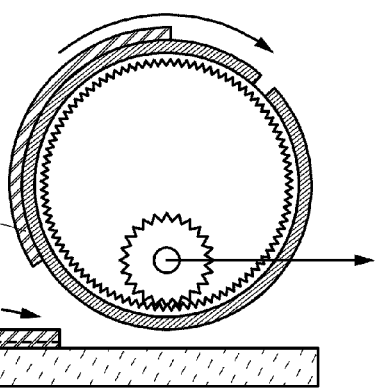

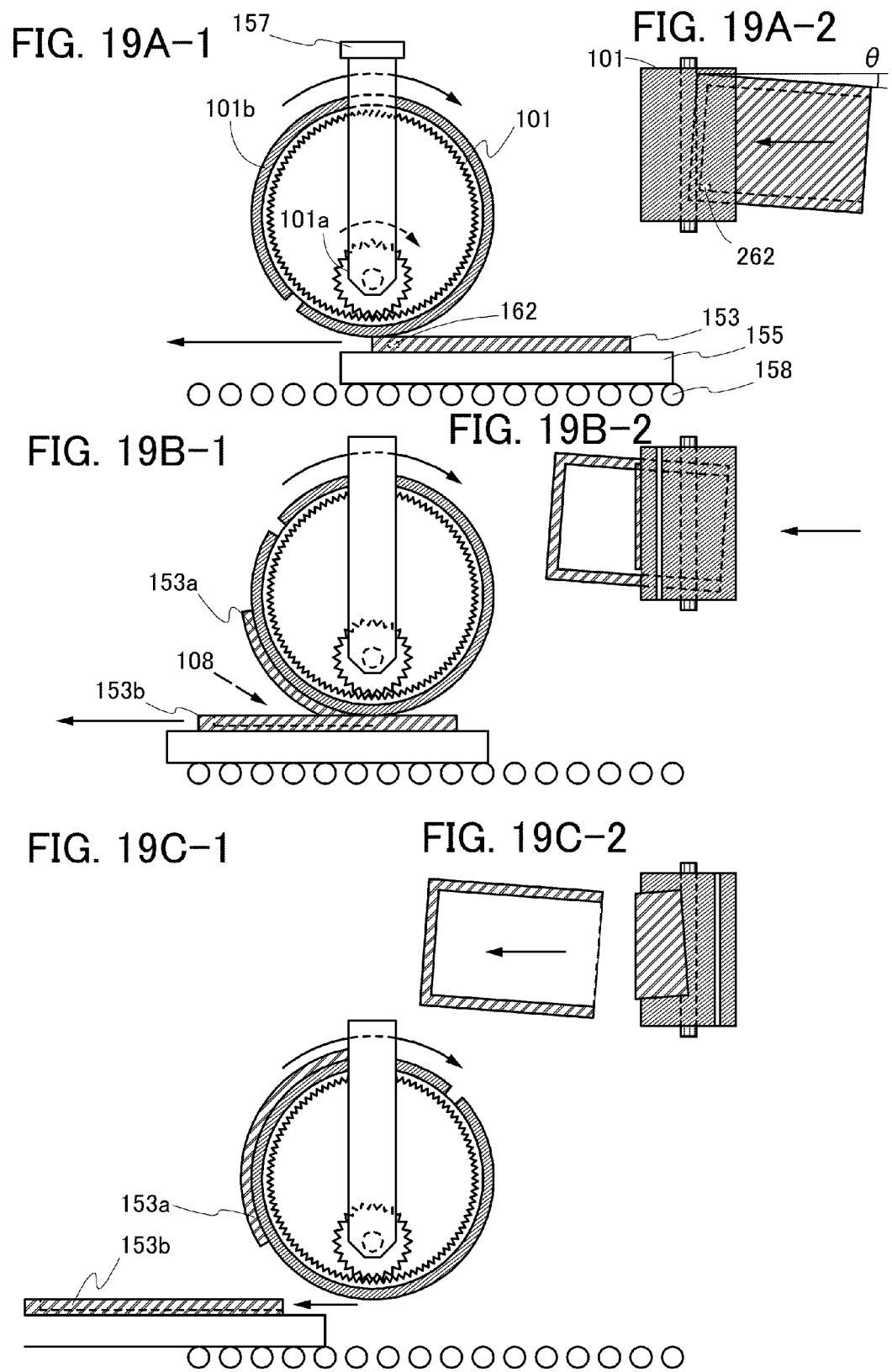

SEMICONDUCTOR DEVICE AND MANUFACTURING METHOD THEREOF

TECHNICAL FIELD

The present invention relates to an object, a method, or a manufacturing method. Alternatively, the present invention relates to a process, a machine, manufacture, or a composition of matter. One embodiment of the present invention relates to a semiconductor device, a light-emitting device, a display device, an electronic device, a lighting device, and a manufacturing method thereof. In particular, one embodiment of the present invention relates to a light-emitting device using an organic electroluminescence (hereinafter also referred to as EL) phenomenon, and a manufacturing method thereof. In particular, one embodiment of the present invention relates to a separation method and a method for manufacturing a device including a separation step.

Note that in this specification, a semiconductor device refers to any device that can function by utilizing semiconductor characteristics, and an electro-optical device, a semiconductor circuit, and an electronic device are all included in the category of semiconductor devices.

BACKGROUND ART

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for manufacturing a device using a flexible substrate, a technique has been developed in which a functional element such as a thin film transistor or an organic EL element is formed over a formation substrate (e.g., a glass substrate or a quartz substrate), and then the functional element is transferred to a flexible substrate. This technique needs a step of separating a layer including the functional element from the formation substrate (also referred to as a separation step).

A technique has been proposed in which an element formed over a glass substrate is separated from the substrate and transferred to another base material such as a plastic film.

Separation and transfer techniques described in Patent Documents 1 and 2 are proposed. Patent Document 1 discloses a separation technique in which a silicon oxide film serving as a separation layer is removed by wet etching. In addition, Patent Document 2 discloses a separation technique in which a silicon film serving as a separation layer is removed by dry etching.

A separation and transfer technique described in Patent Document 3 is also proposed. Patent Document 1 discloses a technique in which a metal layer (Ti, Al, Ta, W, Mo, Cu, Cr, Nd, Fe, Ni, Co, Ru, Rh, Pd, Os, or Ir) is formed over a substrate and an oxide layer is stacked thereover; at this time, a metal oxide layer of the metal layer is formed at an interface between the metal layer and the oxide layer, and separation is carried out in a later step by utilizing this metal oxide layer.

Prior Art Documents

Patent Documents

[Patent Document 1] Japanese Published Patent Application No. H8-288522

[Patent Document 2] Japanese Published Patent Application No. H8-250745

[Patent Document 3] Japanese Published Patent Application No. 2003-174153

SUMMARY OF THE INVENTION

Problems to be Solved by the Invention

An object of one embodiment of the present invention is to provide a novel separation method or a novel manufacturing method of a device.

Furthermore, an object of one embodiment of the present invention is to provide a novel light-emitting device, display device, electronic device, or lighting device.

Means for Solving the Problems

Disclosed is a technique in which an element capable of being manufactured in a relatively low temperature process (lower than 500° C.), typically a transistor using a polysilicon film or the like, is detached (i.e., separated) from a glass substrate and then arranged (i.e., transferred) on a resin film (typically a flexible substrate or the like).

For example, in the case where a tungsten oxide film, which is tightly anchored by $N_2O$ plasma or the like, is formed on an inorganic film such as a tungsten film, adhesion can be relatively high at the time of deposition. After that, a separation trigger is formed; then, cleavage occurs therefrom, and a layer to be separated can be easily separated from a formation substrate and transferred to another substrate. In addition, when a bond of M-O—W (M is a given element) is divided by application of physical force, a liquid is absorbed into the gap, whereby the bond becomes bonds of M-OH HO—W with a longer bond distance and the detachment can be promoted accordingly.

Note that in the detachment, a liquid may be sprayed in an atomized form or in a vaporized form. Examples of the liquid include pure water and an organic solvent, and a neutral, alkali, or acid aqueous solution, an aqueous solution in which a salt is dissolved, or the like may be used.

In addition, the temperature of the liquid and the substrate at the time of dynamic separation is set in the range from room temperature to 120° C., and preferably set to 60° C. to 90° C.

Bending a device causes a problem in that cracks are generated by force applied when the device is bent. A resin substrate or a resin film might be changed in quality (expanded and contracted, swelled, cured, or the like) through a step of applying heat (heat treatment, deposition treatment, or the like) or a step using moisture (cleaning treatment or the like). There is also a problem in that degassing occurs when the resin substrate or the resin film is exposed to vacuum. Furthermore, the resin substrate or the resin film does not have, though depending on the material, a blocking property against impurities and moisture. Thus, when a barrier layer is provided on the surface of the resin substrate or the resin film, the barrier layer is formed at a temperature lower than or equal to the upper temperature limit of the resin substrate or the resin film, so that it is difficult to obtain a barrier layer with an excellent blocking property.

Furthermore, in the case where devices are mass-produced by deposition on a resin film, for example, a manufacturing apparatus, a carrying apparatus, or the like that can carry the film might have a complicated structure. Moreover, new purchase of a manufacturing apparatus that enables a use of a thin film as a base increases capital investment.

Thus, preferably, a film is deposited on a glass substrate and carried, a device is formed over the glass substrate, and then the device is detached from the glass substrate and placed on a resin film.

Specifically, a transistor including a semiconductor film such as polysilicon and a buffer layer containing hydrogen are formed over a glass substrate in a process at a temperature lower than or equal to the upper temperature limit of a resin substrate or a resin film; the buffer layer is separated from the glass substrate; then, a semiconductor device including the semiconductor film is manufactured over a resin substrate or a resin film. Note that the buffer layer containing hydrogen may function as a barrier layer after the manufacturing of the transistor.

The lower process temperature results in a shorter process time needed for increasing or decreasing the temperature.

As a method for detaching the glass substrate, a separation layer is formed over the glass substrate, the buffer layer containing hydrogen is formed, the semiconductor film such as polysilicon is formed over the buffer layer, an element such as a transistor is manufactured, and the glass substrate is detached from the inside or interface of the separation layer. When the semiconductor film such as polysilicon is formed or when the element such as the transistor is manufactured, heat treatment or light irradiation (laser light irradiation or the like) is performed so that hydrogen in the buffer layer is supplied to the separation layer, which makes it easy to perform a later step of detaching the substrate.

A structure of the invention disclosed in this specification is a manufacturing method of a semiconductor device including the steps of forming a separation layer over a substrate having an insulating surface, forming a buffer layer containing hydrogen over the separation layer, forming a semiconductor layer containing silicon over the buffer layer containing hydrogen, performing light irradiation for crystallization on the semiconductor layer containing silicon, performing heat treatment for supplying hydrogen contained in the buffer layer to the separation layer, and detaching the substrate from the interface or inside of the separation layer.

Alternatively, hydrogen as well as an impurity element (e.g., boron) imparting n-type conductivity or an impurity element (e.g., phosphorus) imparting p-type conductivity may be added to the semiconductor layer containing silicon, so that hydrogen is also added to the separation layer and a later step of detaching the substrate is performed easily. In that case, a structure of the invention disclosed in this specification is a manufacturing method of a semiconductor device including the steps of forming a separation layer over a substrate having an insulating surface, forming a semiconductor layer containing silicon over the separation layer, performing light irradiation for crystallization on the semiconductor layer containing silicon, adding hydrogen and a p-type impurity element or an n-type impurity element to the semiconductor layer containing silicon and the separation layer, performing heat treatment for supplying hydrogen to the separation layer, and detaching the substrate from the interface or inside of the separation layer.

Alternatively, hydrogen and a p-type impurity element or an n-type impurity element may be added to a separation layer over which a buffer layer containing hydrogen is formed. In that case, a structure of the invention disclosed in this specification is a manufacturing method of a semiconductor device including the steps of forming a separation layer over a substrate having an insulating surface, forming a buffer layer containing hydrogen over the separation layer, forming a semiconductor layer containing silicon over the buffer layer containing hydrogen, performing light irradiation for crystallization on the semiconductor layer containing silicon, adding hydrogen and a p-type impurity element or an n-type impurity element to the semiconductor layer containing silicon and the separation layer, performing heat treatment for supplying hydrogen to the separation layer, and detaching the substrate from the interface or inside of the separation layer.

Furthermore, in each of the aforementioned structures, a buffer layer containing hydrogen may further be formed between the substrate and the separation layer. In that case, a first buffer layer containing hydrogen is formed between the substrate and the separation layer, and a second buffer layer containing hydrogen is formed between the separation layer and the semiconductor layer containing silicon. The layer containing hydrogen may be provided on both the upper side and the lower side of the separation layer. Such a structure makes it easy to perform a later step of detaching the substrate. In such a case where hydrogen is supplied from both the upper side and the lower side, the thickness of the separation layer is preferably as small as greater than or equal to 0.1 nm and less than 10 nm. In addition, the use of such a thin separation layer allows separation to be performed with a small amount of force regardless of the stress of a layer to be separated. Moreover, with use of such a thin separation layer, cracks generated in the layer to be separated in separation can be prevented regardless of the stress of the layer to be separated. That is, by applying one embodiment of the present invention, the yield of a separation process can be improved regardless of the structure of the layer to be separated.

As the separation layer, a metal film mainly including an element selected from tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir) is formed to a thickness of 0.1 nm to 200 nm. When a tungsten film is used as the separation layer, a tungsten oxide film can be formed between the tungsten film and a first layer by $N_2O$ plasma treatment. The formation of the tungsten oxide film by $N_2O$ plasma treatment enables the separation of the layer to be separated with a small amount of force.

In addition, the heat treatment for supplying hydrogen to the separation layer may be performed at the same time as the manufacturing process of the transistor, and includes laser light irradiation treatment for crystallization, treatment for activating the added impurity element (boron or phosphorus), hydrogenation treatment for supplying hydrogen to the semiconductor layer from the insulating layer containing hydrogen over the semiconductor layer, and the like. The heat treatment allows $WO_3$ in the oxide layer to be reduced by hydrogen released from the layer to be separated, so that the oxide layer containing a large amount of $WO_2$ can be formed. As a result, the separability from the substrate can be improved.

Furthermore, a roller such as a drum roller can be used for detachment. Part of the roller surface may have adhesiveness. For example, an adhesive tape or the like may be put on part of the roller surface. By rotating the roller, the layer to be separated is wound and detached from the substrate having an insulating surface.

In addition, the tungsten oxide film remains on the layer to be separated side in some cases after the detachment because the tungsten film and the tungsten oxide film are detached at their interface, and the remaining tungsten oxide film might adversely affect the characteristics of the transistor. Thus, a step of removing the tungsten oxide film may be performed after the step of detaching the separation layer and the layer to be separated.

In the manufacturing method, the resin substrate or the resin film is provided immediately before or after the detachment from the glass substrate; thus, the resin substrate or the resin film does not go through a manufacturing process of a transistor (including a laser irradiation step, a cleaning step, a vacuum heating step, a doping step, and the like). Thus, the device structure is sandwiched between resin films without damage, so that a highly reliable semiconductor device can be achieved.

Furthermore, the semiconductor device obtained by the aforementioned manufacturing method also has the feature: the buffer layer provided at least between the separation layer and the semiconductor layer containing silicon includes hydrogen and a p-type impurity element or an n-type impurity element, and stress can be relieved by adjusting their content. Therefore, the buffer layer at least including the p-type impurity element or the n-type impurity element can suppress generation of cracks.

The buffer layer is a silicon oxide film, a silicon nitride film, a silicon oxynitride film, an aluminum oxide film, an aluminum nitride film, an aluminum oxynitride film, an yttrium oxide film, or the like, and the boron concentration in the buffer layer measured by SIMS is in the range of $1\times10^{16}/cm^3$ or more, preferably $1\times10^{19}/cm^3$ to $1\times10^{21}/cm^3$.

In addition, the buffer layer may be formed by depositing the aluminum oxide film, the yttrium oxide film, or the like by an aerosol deposition (AD) method. Alternatively, the buffer layer may have a stacked-layer structure; for example, a silicon oxynitride film formed by a plasma CVD method and an aluminum oxide film deposited by the aerosol deposition method may be stacked. In the case where the deposition by the aerosol deposition method is performed under reduced pressure, a stacked layer can be formed without exposure to the air.

Furthermore, the buffer layer is not limited to an insulating film as long as the layer contains hydrogen and may be a metal film, a semiconductor film such as an amorphous silicon film, or a stacked layer thereof.

In addition, application to any element structure, e.g., any transistor structure is possible; for example, a top gate transistor, a bottom gate (inverted staggered) transistor, or a forward staggered transistor can be used. Moreover, a multi-gate transistor having a plurality of channel formation regions, e.g., a double-gate transistor, may be used without limitation to a transistor having a single-gate structure.

Furthermore, a large-sized display device using a resin film can be manufactured, and not only a passive-matrix liquid crystal display device or a passive-matrix light-emitting device but also an active-matrix liquid crystal display device or an active-matrix light-emitting device can be manufactured.

In addition, the resin film used for the base refers to a film-like plastic substrate, for example, a plastic substrate of polyimide (PI), an aramid resin substrate, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, or the like. The resin film also includes a flexible substrate. The resin film also includes a fiber or the like, e.g., a prepreg. Furthermore, a base is not limited to the resin film, and a transparent nonwoven fabric formed by processing pulp into a continuous sheet, a sheet including an artificial spider's thread fiber containing protein called fibroin, a complex including any of them mixed with a resin, a stack of a resin film and a nonwoven fabric containing a cellulose fiber whose fiber width is 4 nm or more and 100 nm or less, or a stack of a resin film and a sheet including an artificial spider's thread fiber may be used.

Effect of the Invention

With use of a flexible resin film, a bendable semiconductor device can be achieved. At the time of or after manufacturing the bendable semiconductor device, generation of cracks inside the semiconductor device can be suppressed and a highly reliable semiconductor device can be achieved.

Note that the description of these effects does not disturb the existence of other effects. Note that one embodiment of the present invention does not necessarily have all of these effects. Note that the other effects will be apparent from the description of the specification, the drawings, the claims, and the like, and can be derived from the description of the specification, the drawings, the claims, and the like.

BRIEF DESCRIPTION OF THE DRAWINGS

FIG. 6 Views showing an example of a light-emitting device.

FIG. 8 Views showing an example of a light-emitting device.

FIG. 17 Views showing an example of a separation apparatus.

FIG. 18 Views describing a structure and operation of a separation apparatus of one embodiment of the present invention.

FIG. 19 Views describing a structure and operation of a separation apparatus of one embodiment of the present invention.

MODE FOR CARRYING OUT THE INVENTION

Figure 1A:
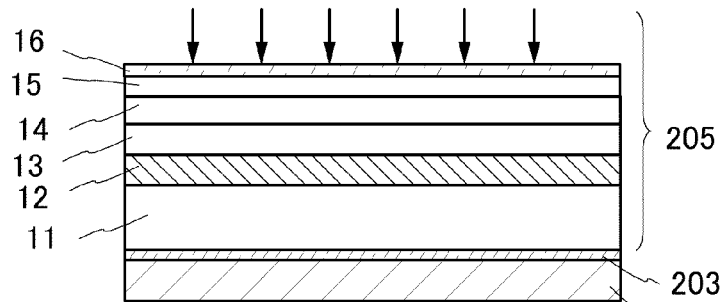
FIG. 1 Cross-sectional views describing a manufacturing method of a separation layer and a layer to be separated.

Hereinafter, the embodiments are described in detail with reference to the drawings. However, the embodiments are not limited to the following description, and it is easily understood by those skilled in the art that modes and details disclosed herein can be modified in various ways. Furthermore, the embodiments are not construed as being limited to description of the embodiments given below.

Embodiment 1

Shown in this embodiment is an example in which a layer to be separated 205 including a transistor is formed over a separation layer 203.

First, the separation layer 203 is formed over a formation substrate 201.

As the formation substrate 201, a substrate having heat resistance high enough to withstand at least the process temperature in a manufacturing process is used. For example, as the formation substrate 201, a glass substrate, a quartz substrate, a sapphire substrate, a semiconductor substrate, a ceramic substrate, a metal substrate, a resin substrate, or a plastic substrate can be used.

Note that for the sake of improved productivity, a large-sized glass substrate is preferably used as the formation substrate 201. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

In addition, one embodiment of the present invention uses a tungsten film with a thickness of greater than or equal to 0.1 nm and less than 200 nm, which is formed by a sputtering method over the formation substrate 201. In this embodiment, after a tungsten film with a thickness of 30 nm is formed by a sputtering method, a tungsten oxide film is formed on its surface by nitrous oxide ($N_2O$) plasma treatment, oxygen plasma treatment, or the like without exposure to the air, and a buffer layer 11 (e.g., a silicon oxynitride film) is formed without exposure to the air. The silicon oxynitride film used for the buffer layer 11 is deposited to a thickness of 600 nm under the conditions where a PCVD apparatus is used, a silane gas and an $N_2O$ gas are used, and the deposition temperature is 330° C.

At the time of performing a separating and transferring process, the tungsten oxide film preferably includes a lot of tungsten oxide denoted by WOx with a composition where x is greater than 0 and smaller than 3 ($0<X<3$). In the case where WOx is WnO(3n−1) or WnO(3n−2) (n is a natural number), which is a homologous series, shear is easily caused by heating because there is a crystal optical shear plane therein. Forming the tungsten oxide film by $N_2O$ plasma treatment enables separation of the layer to be separated from the substrate with a small amount of force. Note that the $N_2O$ plasma treatment is performed in an atmosphere at 330° C., with a power of 500 W and a pressure of 100 Pa, and for 240 seconds.

Then, a resist mask is formed over the buffer layer 11 with use of a mask, and the tungsten film at the periphery of the substrate is selectively removed. The buffer layer 11 is also etched selectively.

Then, a first moisture-proof film 12, a second moisture-proof film 13, a third moisture-proof film 14, and a fourth moisture-proof film 15 are sequentially deposited to be stacked over the buffer layer 11. A silicon nitride film with a thickness of 200 nm is used as the first moisture-proof film 12, and a silicon nitride oxide film with a thickness of 200 nm is used as the second moisture-proof film 13. A silicon oxynitride film with a thickness of 140 nm is used as the third moisture-proof film 14, and a silicon nitride oxide film with a thickness of 100 nm is used as the fourth moisture-proof film 15. The deposition temperature of the first moisture-proof film 12, the second moisture-proof film 13, the third moisture-proof film 14, and the fourth moisture-proof film 15 is 330° C. Note that the moisture-proof film has the four-layer structure here; however, it is not particularly limited and may include a single layer, two layers, three layers, or five or more layers.

Then, a semiconductor layer 16 is formed. The semiconductor layer 16 is formed by forming a semiconductor film having an amorphous structure by a known means (a sputtering method, an LPCVD method, a plasma CVD method, or the like), performing a known crystallization treatment (a laser crystallization method, a thermal crystallization method, a thermal crystallization method using a catalyst such as nickel, or the like) so that a crystalline semiconductor film is obtained, and patterning the crystalline semiconductor film into a desired shape using a first photomask. This semiconductor layer is formed to a thickness of 25 nm to 80 nm (preferably 30 nm to 70 nm). Although there is no limitation on the material of the crystalline semiconductor film, preferably, silicon, a silicon-germanium (SiGe) alloy, or the like is used.

Shown in this embodiment is an example of crystallization with light irradiation as shown in FIG. 1(A). Light for crystallization is infrared light, visible light, or ultraviolet light. This light also refers to light that has a wavelength of 10 μm or less and whose wavelength region is mainly in an infrared light region; for example, the light may be emitted from a halogen lamp, a metal halide lamp, a xenon arc lamp, a carbon arc lamp, or a mercury lamp. A heat treatment method using intense light emitted from these light sources is called rapid thermal anneal (hereinafter referred to as RTA), which is known as a heat treatment technique for applying heat instantaneously for several tens of seconds to several microseconds. Furthermore, the light for crystallization may be emitted from an excimer laser, a YAG laser, a $YVO_4$ laser, or a YLF laser. The irradiation with such intense light can reduce the resistance value of the semiconductor film having a crystalline structure. Note that before the light irradiation, heat treatment for releasing hydrogen contained in the semiconductor layer 16 may be performed.

Then, a gate insulating film covering a crystalline semiconductor film 17 is formed. A gate insulating film 18 is formed by a plasma CVD method or a sputtering method to a thickness of 1 nm to 100 nm, preferably to a thickness as small as 10 nm to 50 nm, and has a single-layer or stacked-layer structure of an insulating film containing silicon.

Then, a conductive film with a thickness of 100 nm to 600 nm is formed over the gate insulating film 18. Here, the conductive film is formed using a W film by a sputtering method. Note that the conductive film is W, but is not particularly limited to this and may be a single layer of an element selected from Ta, W, Ti, Mo, Al, and Cu, or an alloy material or a compound material containing any of these elements as the main component, or a stack of these layers. Alternatively, a semiconductor film typified by a polycrystalline silicon film doped with an impurity element such as phosphorus may be used.

Figure 1B:
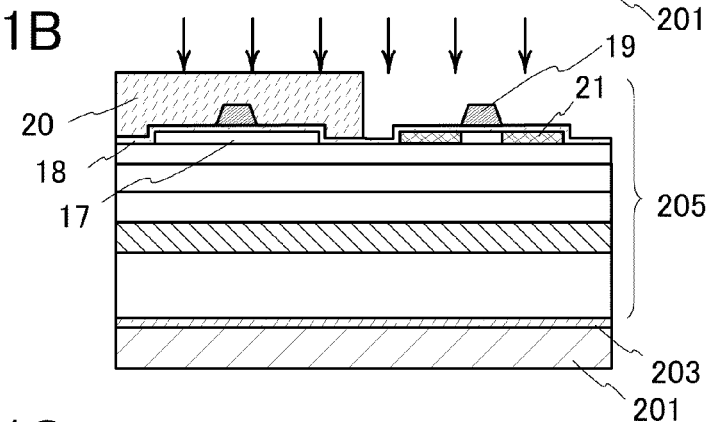

Then, a resist mask is formed with use of a second photomask, and etching is performed by a dry etching method or a wet etching method. In this etching step, the conductive film is etched so that a conductive layer 19 is obtained as shown in FIG. 1(B).

Then, after the resist mask is removed, a resist mask 20 is newly formed with use of a third photomask, and a first doping step is performed to dope the semiconductor with an impurity element imparting p-type conductivity (typically, boron) at high concentration. In this first doping step, doping is performed through the gate insulating film 18 so that a high-concentration impurity region 21 is formed as shown in FIG. 1(B). At the time of this first doping step, the buffer layer 11, the first moisture-proof film 12, the second moisture-proof film 13, the third moisture-proof film 14, and the fourth moisture-proof film 15 are also doped with hydrogen. It is important to add hydrogen to the buffer layer 11, the first moisture-proof film 12, the second moisture-proof film 13, the third moisture-proof film 14, and the fourth moisture-proof film 15. This allows hydrogen to be supplied to the separation layer 203 at the time of later heat treatment to facilitate separation.

Then, after the resist mask is removed, a resist mask is newly formed with use of a fourth photomask, and a second doping step is performed for doping with an impurity element imparting n-type conductivity (typically, phosphorus or As) at high concentration. The resist mask covers a region serving as a p-channel TFT and the vicinity of the conductive layer 19. In this second doping step, doping is performed through the gate insulating film 18 so that a high-concentration impurity region is formed in a self-aligned manner with the conductive layer 19 used as a mask. Depending on the conditions of the second doping step, hydrogen can also be added to the buffer layer 11, the first moisture-proof film 12, the second moisture-proof film 13, the third moisture-proof film 14, and the fourth moisture-proof film 15.

Figure 1C:
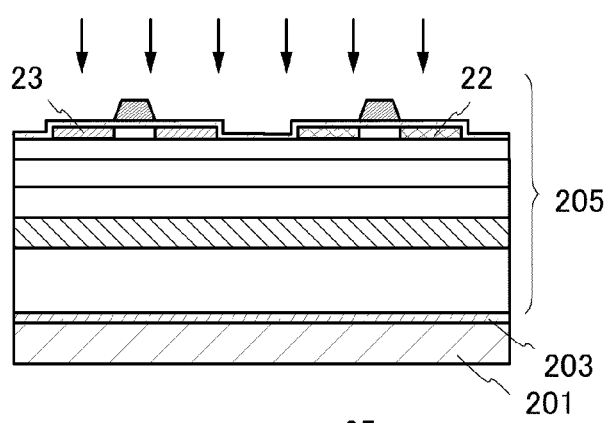

Then, the resist mask is removed, which is followed by an activation step of activating the n-type or p-type impurity elements that have been added to the semiconductor layer at the respective concentrations and reducing the resistances of the impurity regions. In this embodiment, the impurity elements imparting one conductivity type that have been added to the impurity regions are activated by irradiation with light (using an excimer laser light source with a wavelength of 400 nm or less is used) as shown in FIG. 1(C), whereby a source region 22 or a drain region 23 is formed. Alternatively, the activation may be performed by heat treatment, or both the heat treatment and the light irradiation may be performed at the same time.

Then, an interlayer insulating film 24 is formed. As a step of forming the interlayer insulating film 24, an insulating film containing hydrogen may be formed and heat treatment may be performed for the activation of the impurity elements added to the semiconductor layer and for hydrogenation. The hydrogenation is a step of terminating dangling bonds of the semiconductor layer by hydrogen contained in the insulating film containing hydrogen. As the interlayer insulating film 24, a silicon nitride film or a silicon oxynitride film is used. Then, contact holes reaching the source region or the drain region are formed and a conductive film is further stacked. Subsequently, patterning is performed to form a source electrode and a drain electrode 25, whereby an n-channel transistor 30 or a p-channel transistor 40 is completed. ((FIG. 1(D)) Furthermore, a CMOS circuit can be formed by combining the n-channel transistor 30 and the p-channel transistor 40.

The layer to be separated 205 is a stack including at least the n-channel transistor 30 or the p-channel transistor 40 over the buffer layer 11.

Figure 1D:
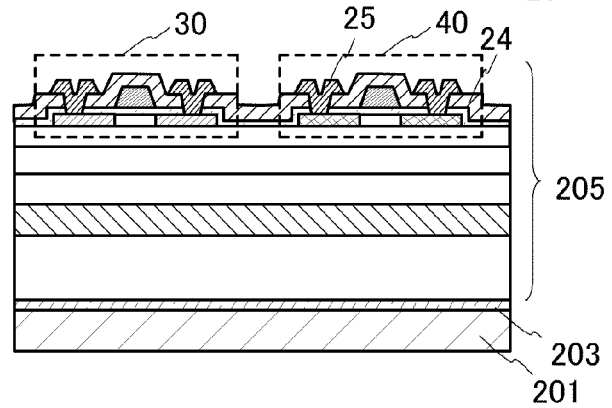
Figure 2A:
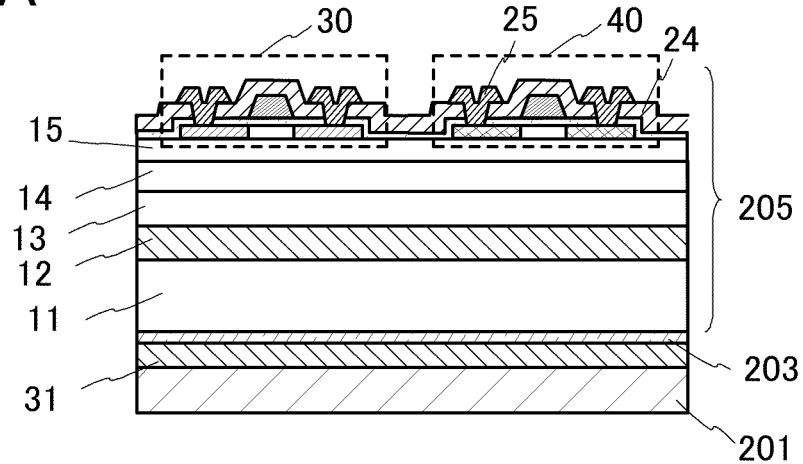
FIG. 2 Cross-sectional views of a separation layer and a layer to be separated.

In addition, an example partly different from FIG. 1(D) is shown in FIG. 2(A). FIG. 2(A) shows an example in which a buffer layer 31 is provided between the formation substrate 201 and the separation layer 203. The use of an insulating film containing hydrogen as the buffer layer 31 allows hydrogen to be supplied to the separation layer 203 at the time of later heat treatment to facilitate separation. Furthermore, the buffer layer 31 can function as an etching stopper that protects the formation substrate 201 at the time of etching of the separation layer 203.

Figure 2B:
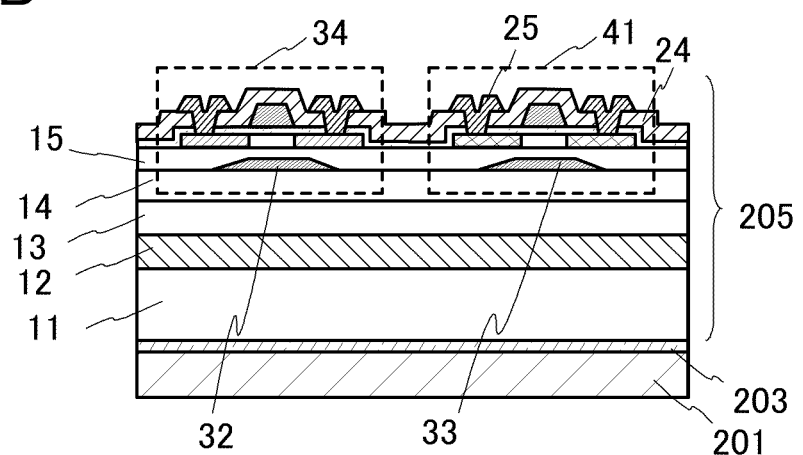

In addition, an example partly different from FIG. 1(D) is shown in FIG. 2(B). FIG. 2(B) shows an example in which back gates 32 and 33 are provided. The back gates 32 and 33 may be electrically connected to a gate electrode of an n-channel transistor 34 or a gate electrode of a p-channel transistor 41 so as to have the same potential. Alternatively, different potentials may be applied to the back gates 32 and 33 and the gate electrode of the n-channel transistor 34 or the gate electrode of the p-channel transistor 41 so as to control the threshold value. When the back gates 32 and 33 are provided under the semiconductor layer, crystallization and activation can be effectively performed at the time of laser light irradiation.

Figure 2C:
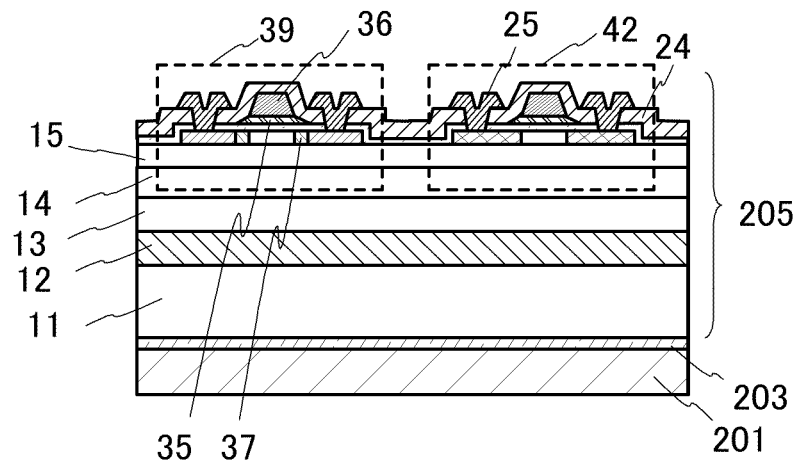

In addition, an example partly different from FIG. 1(D) is shown in FIG. 2(C). In FIG. 2(C), a gate electrode of an n-channel transistor 39 has a two-layer structure. Furthermore, in this example, a low-concentration impurity region 37 (also referred to as an LDD region) is provided under an end portion of a first gate electrode 35. The width of the first gate electrode 35 in a channel length direction is larger than that of the second gate electrode 36, and the low-concentration impurity region 37 can be provided in a self-aligned manner between a channel formation region and a high-concentration impurity region. In addition, in the p-channel transistor 42, the high-concentration impurity region is also formed under an end portion of the first gate electrode 35 as an example.

Furthermore, as the layer to be separated 205, a pixel electrode, a partition wall, or a light-emitting element including an organic compound-containing layer as a light-emitting layer may be formed in addition to the n-channel transistor and the p-channel transistor. In addition, a sensor element or the like may also be formed.

Furthermore, in the case where a CMOS circuit or the like need not be used, the layer to be separated 205 may include a circuit using only the n-channel transistor, resulting in a reduced number of steps. Also in the case where the layer to be separated 205 includes a circuit using only the p-channel transistor, the number of steps can be reduced.

Embodiment 2

In this embodiment, an example of manufacturing a flexible display panel by a separation method is described. In this embodiment, a manufacturing example using a separation layer is described below.

Figure 3A:
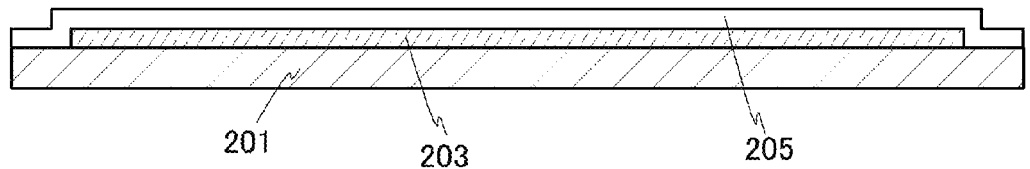
FIG. 3 Views describing a separation method.
Figure 3B:
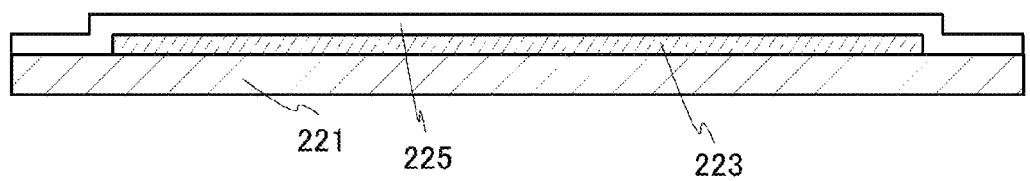

First, the separation layer 203 is formed over the formation substrate 201, and the layer to be separated 205 is formed over the separation layer 203 (FIG. 3(A)). The separation layer 203 can be formed by the manufacturing method shown in Embodiment 1. Moreover, a separation layer 223 is formed over a formation substrate 221, and a layer to be separated 225 is formed over the separation layer 223 (FIG. 3(B)).

In the case where a glass substrate is used as the formation substrate 201, an insulating layer such as a silicon oxide film, a silicon oxynitride film, a silicon nitride film, or a silicon nitride oxide film is preferably formed as a base film between the formation substrate 201 and the separation layer 203 because the base film can function as an etching stopper when a tungsten film is selectively etched, whereby the glass substrate can be protected.

For example, when a tungsten film is used as the separation layer, a tungsten oxide film can be formed between the tungsten film and a first layer by $N_2O$ plasma treatment. The formation of the tungsten oxide film by $N_2O$ plasma treatment enables the separation of the layer to be separated with a small amount of force. At this time, the tungsten oxide film remains on the layer to be separated side in some cases when the tungsten film and the tungsten oxide film are detached at their interface, and the remaining tungsten oxide film might adversely affect the characteristics of the transistor. Thus, a step of removing the tungsten oxide film is preferably performed after the step of detaching the separation layer and the layer to be separated.

Furthermore, in one embodiment of the present invention, a tungsten film with a thickness of greater than or equal to 0.1 nm and less than 200 nm is formed over the substrate by a sputtering method. In this embodiment, a 30-nm-thick tungsten film is formed by a sputtering method.

Figure 3C:
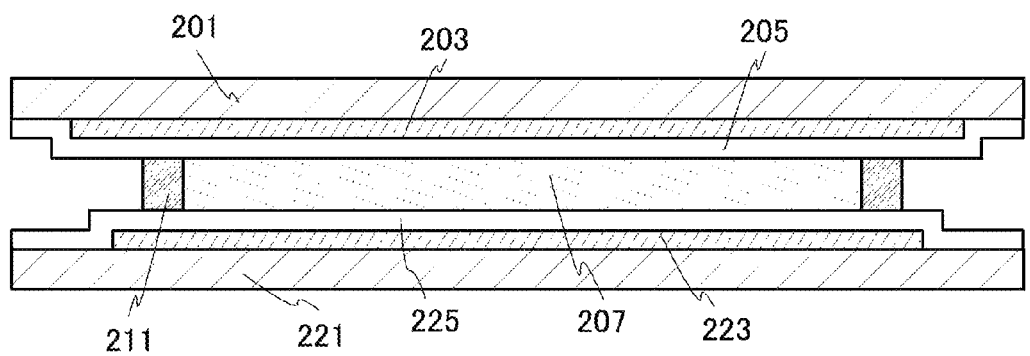

Next, the formation substrate 201 and the formation substrate 221 are attached to each other by using a bonding layer 207 and a frame-like bonding layer 211 so that the surfaces over which the layers to be separated are formed face each other, and then, the bonding layer 207 and the frame-like bonding layer 211 are cured (FIG. 3(C)). Here, the frame-like bonding layer 211 and the bonding layer 207 inside the frame-like bonding layer 211 are provided over the layer to be separated 225 and after that, the formation substrate 201 and the formation substrate 221 are made to face each other and are attached to each other.

Note that the formation substrate 201 and the formation substrate 221 are preferably attached to each other in a reduced-pressure atmosphere.

Figure 3D:
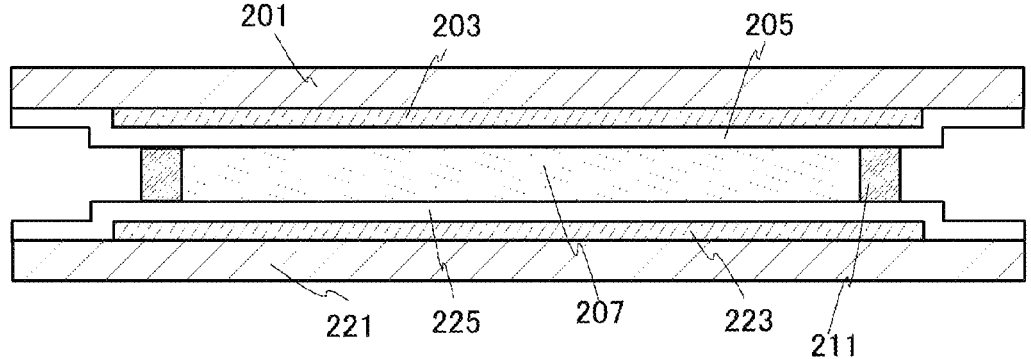

Note that although FIG. 3(C) shows the case where the separation layer 203 and the separation layer 223 are different in size, separation layers having the same size as shown in FIG. 3(D) may be used.

The bonding layer 207 is arranged so as to overlap with the separation layer 203, the layer to be separated 205, the layer to be separated 225, and the separation layer 223. Then, an end portion of the bonding layer 207 is preferably positioned inside an end portion of at least one of the separation layer 203 and the separation layer 223 (the separation layer which is desirably separated first). Accordingly, strong adhesion between the formation substrate 201 and the formation substrate 221 can be suppressed; thus, a decrease in the yield of a subsequent separation process can be suppressed.

Figure 4A:
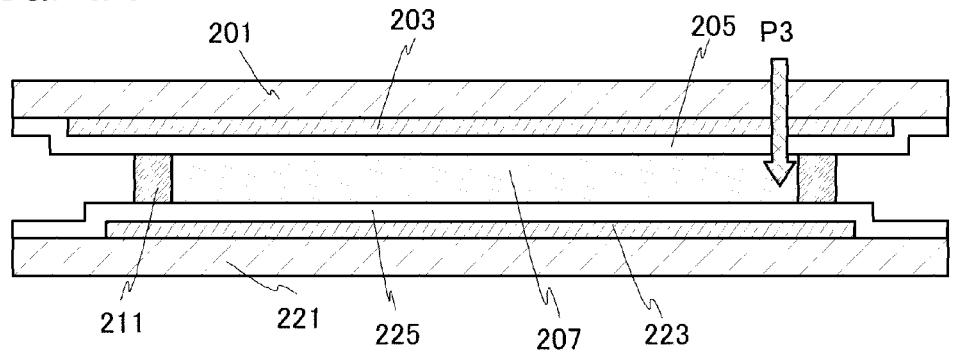
FIG. 4 Views describing a separation method.

Next, a separation trigger is formed by laser light irradiation (FIGS. 4(A) and (B)).

Either the formation substrate 201 or the formation substrate 221 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed over only one of the substrates, the substrate on the side where the element is formed may be separated first or the other substrate may be separated first. Here, an example in which the formation substrate 201 is separated first is described.

A region where the bonding layer 207 in a cured state or the frame-like bonding layer 211 in a cured state, the layer to be separated 205, and the separation layer 203 overlap with one another is irradiated with laser light. Here, an example in which the bonding layer 207 is in a cured state and the frame-like bonding layer 211 is not in a cured state is described, and the bonding layer 207 in a cured state is irradiated with laser light (see an arrow P3 in FIG. 4(A)).

Figure 4B:
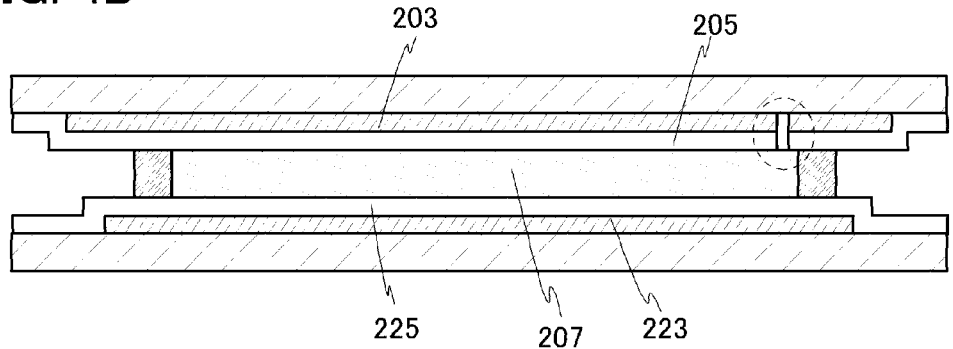

By removing part of the first layer, a separation trigger can be formed (see a region surrounded by a dotted line in FIG. 4(B)). At this time, not only the first layer but also the other layers of the layer to be separated 205, the separation layer 203, and the bonding layer 207 may be partly removed.

It is preferred that laser light irradiation be performed from the side of the substrate provided with the separation layer that is desirably separated. In the case where a region where the separation layer 203 and the separation layer 223 overlap with each other is irradiated with laser light, the formation substrate 201 and the separation layer 203 can be selectively separated by cracking only the layer to be separated 205 of the layers to be separated 205 and 225 (see the region surrounded by the dotted line in FIG. 4(B)).

When a separation trigger is formed in both the layer to be separated 205 on the separation layer 203 side and the layer to be separated 225 on the separation layer 223 side in the case where the region where the separation layer 203 and the separation layer 223 overlap with each other is irradiated with laser light, it might be difficult to selectively separate one of the formation substrates. Therefore, laser light irradiation conditions are sometimes restricted so that only one of the layers to be separated is cracked.

Figure 4C:
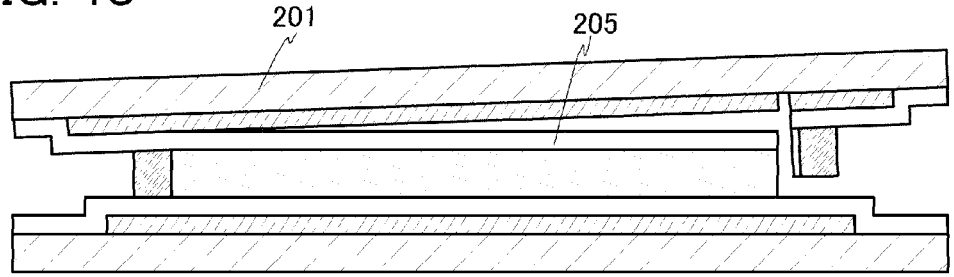

Then, the layer to be separated 205 and the formation substrate 201 are detached from each other from the formed separation trigger (FIG. 4(C)). Consequently, the layer to be separated 205 can be transferred from the formation substrate 201 to the formation substrate 221. Note that the formation substrate 201 and the layer to be separated 205 may be detached from each other by filling the interface between the separation layer 203 and the layer to be separated 205 with a liquid such as water. A portion between the separation layer 203 and the layer to be separated 205 absorbs a liquid through a capillarity action, which facilitates the detachment. In addition, an adverse effect on the functional element included in the layer to be separated 205 due to static electricity caused at the time of separation (e.g., damage to a semiconductor element from static electricity) can be suppressed. Note that a liquid may be sprayed in the form of mist or steam. As the liquid, pure water, an organic solvent, or the like can be used, and a neutral, alkaline, or acid aqueous solution, an aqueous solution in which a salt is dissolved, or the like can be used. In addition, the liquid may be heated.

Figure 4D:
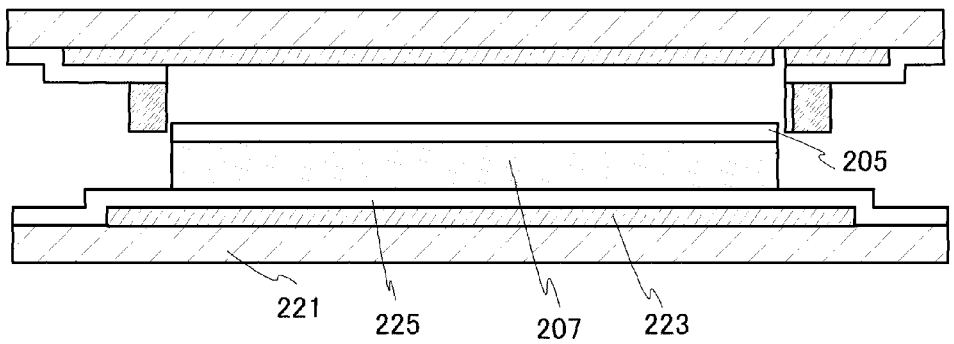
Figure 5A:
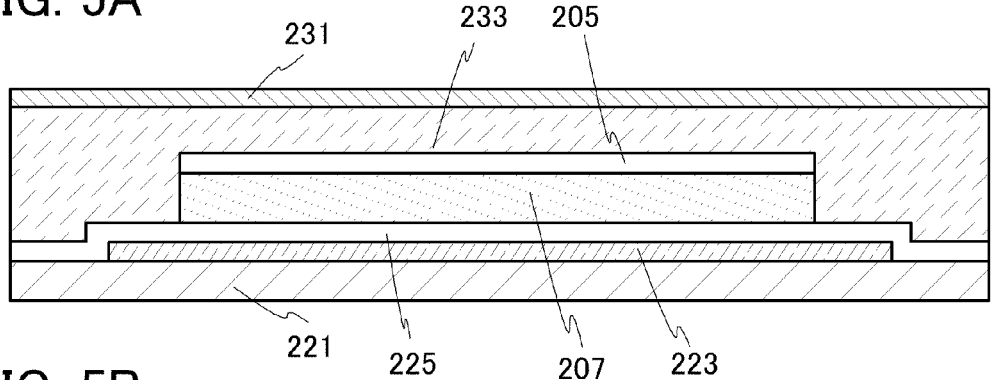
FIG. 5 Views describing a separation method.

The layer to be separated 205 that is separated from the formation substrate 201 in the step shown in FIG. 4(D) is attached to a substrate 231 with a bonding layer 233, and the bonding layer 233 is cured (FIG. 5(A)).

Figure 5B:
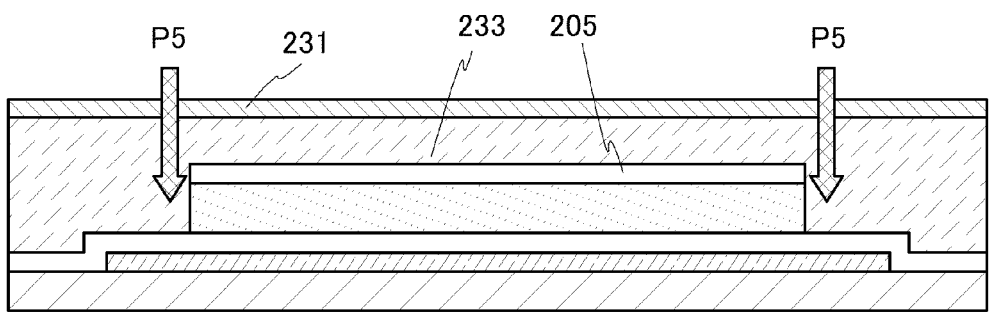

Next, a separation trigger is formed by a sharp knife such as a cutter (FIGS. 5(B) and (C)).

Figure 5C:
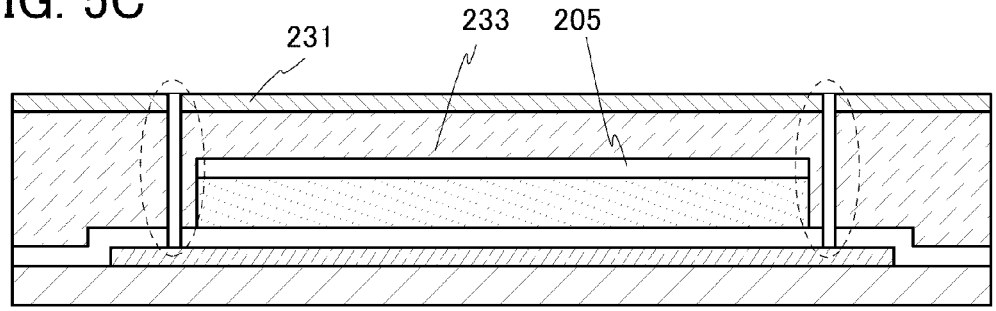

In the case where the substrate 231 on the side where the separation layer 223 is not provided can be cut by a knife or the like, a cut may be made in the substrate 231, the bonding layer 233, and the layer to be separated 225 (see arrows P5 in FIG. 5(B)). Consequently, part of the first layer can be removed; thus, the separation trigger can be formed (see a region surrounded by a dotted line in FIG. 5(C)).

In the case where there is a region in which the formation substrate 221 and the substrate 231 are attached to each other using the bonding layer 233 without overlapping with the separation layer 223 as shown in FIGS. 5(B) and (C), the yield of a subsequent separation process might be decreased depending on the degree of adhesion between the formation substrate 221 and the substrate 231. Therefore, a cut is preferably made in a frame shape in a region where the bonding layer 233 in a cured state and the separation layer 223 overlap with each other to form the separation trigger in the form of a solid line. This can improve the yield of the separation process.

Figure 5D:
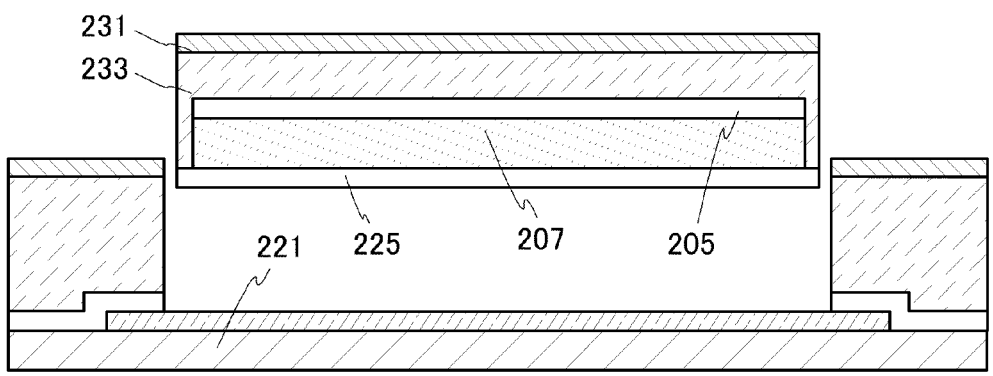

Then, the layer to be separated 225 and the formation substrate 221 are detached from each other from the formed separation trigger (FIG. 5(D)), so that the layer to be separated 225 can be transferred from the formation substrate 221 to the substrate 231.

Furthermore, the formation substrate 221 and the layer to be separated 225 may be detached from each other by filling the interface between the separation layer 223 and the layer to be separated 225 with a liquid such as water. A portion between the separation layer 223 and the layer to be separated 225 absorbs a liquid through a capillarity action, which facilitates the detachment. In addition, an adverse effect on the functional element included in the layer to be separated 225 due to static electricity caused at the time of separation (e.g., damage to a semiconductor element from static electricity) can be suppressed. Note that a liquid may be sprayed in the form of mist or steam. As the liquid, pure water, an organic solvent, or the like can be used, and a neutral, alkaline, or acid aqueous solution, an aqueous solution in which a salt is dissolved, or the like can be used. In addition, the liquid may be heated.

In the separation method of one embodiment of the present invention described above, separation is performed in such a manner that a separation trigger is formed by a sharp knife or the like and then the interface between the separation layer and the layer to be separated is made in a separable state. This can improve the yield of the separation process.

In addition, a pair of formation substrates each provided with a layer to be separated are attached to each other in advance and separation is performed; then, substrates included in a device that is desired to be fabricated can be attached to each other. Therefore, formation substrates having low flexibility such as glass can be attached to each other when the layers to be separated are attached to each other, whereby alignment accuracy at the time of attachment can be improved compared to the case where flexible substrates are attached to each other.

Embodiment 3

In this embodiment, a flexible light-emitting device that can be fabricated by using one embodiment of the present invention is described with reference to FIG. 6, FIG. 7, and FIG. 8. The flexible light-emitting device of this embodiment can be bent with a radius of curvature of 1 mm to 150 mm. The bending can be performed in any direction. The number of bent portions may be one or more than one. For example, the light-emitting device can be folded in two or three.

Note that in this specification, the light-emitting device includes a display device using a light-emitting element. Furthermore, the category of the light-emitting device includes a module in which a light-emitting element is provided with a connector such as an anisotropic conductive film or a tape carrier package (TCP); a module having a TCP at the tip of which a printed wiring board is provided; and a module in which an integrated circuit (IC) is directly mounted on a light-emitting element by a chip on glass (COG) method. The category also includes light-emitting devices used in lighting equipment and the like.

Structure Example 1

FIG. 6(A1) is a plan view of a light-emitting device, and FIG. 6(B) is a cross-sectional view taken along the dashed-dotted line X3-Y3 in FIG. 6(A1). The light-emitting device shown in FIG. 6(B) is a top-emission light-emitting device using a separate coloring method. In this embodiment, the light-emitting device can have, for example, a structure in which light-emitting units of three colors of red (R), green (G), and blue (B) express one color, a structure in which light-emitting units of four colors of red (R), green (G), blue (B), and white (W) express one color, or the like. The color element is not particularly limited and colors other than R, G, B, and W may be used; for example, yellow, cyan, magenta, and the like may be used.

The light-emitting device shown in FIG. 6(A1) includes a light-emitting portion 491, a driver circuit portion 493, and a flexible printed circuit (FPC) 495. An organic EL element and a transistor included in the light-emitting portion 491 and the driver circuit portion 493 are sealed by a flexible substrate 420, a flexible substrate 428, a frame-like bonding layer 404, and a bonding layer 407. FIG. 6(B) shows an example in which a conductive layer 457 and a connector 497 are connected to each other through an opening in the frame-like bonding layer 404.

The light-emitting device shown in FIG. 6(B) includes the flexible substrate 420, an adhesive layer 422, an insulating layer 424, a transistor 455, an insulating layer 463, an insulating layer 465, an insulating layer 405, an organic EL element 450 (the first electrode 401, the EL layer 402, and the second electrode 403), the frame-like bonding layer 404, the bonding layer 407, the flexible substrate 428, and the conductive layer 457. The flexible substrate 428, the bonding layer 407, and the second electrode 403 transmit visible light.

In the light-emitting portion 491 of the light-emitting device in FIG. 6(B), the transistor 455 and the organic EL element 450 are provided over the flexible substrate 420 with the adhesive layer 422 and the insulating layer 424 therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. The first electrode 401 preferably reflects visible light. An end portion of the first electrode 401 is covered with the insulating layer 405.

The driver circuit portion 493 includes a plurality of transistors. FIG. 6(B) shows one of the transistors in the driver circuit portion 493.

The conductive layer 457 is electrically connected to an external input terminal through which a signal (e.g., a video signal, a clock signal, a start signal, or a reset signal) or a potential from the outside is transmitted to the driver circuit portion 493. Here, an example in which the FPC 495 is provided as the external input terminal is described.

To prevent an increase in the number of steps, the conductive layer 457 is preferably formed using the same material and step as those of the electrode or the wiring in the light-emitting portion or the driver circuit portion. Here, an example in which the conductive layer 457 is formed using the same material and step as those of the electrodes included in the transistor is described.

The insulating layer 463 has an effect of suppressing diffusion of impurities into a semiconductor included in the transistor. As the insulating layer 465, an insulating layer having a planarization function is preferably selected in order to reduce surface unevenness due to the transistor.

The frame-like bonding layer 404 preferably has a more excellent gas barrier property than the bonding layer 407 to prevent entry of moisture and oxygen from the outside into the light-emitting device. Thus, a highly reliable light-emitting device can be achieved.

In Structure Example 1, light emitted from the organic EL element 450 is extracted from the light-emitting device through the bonding layer 407. For this reason, the bonding layer 407 preferably has a higher light-transmitting property than the frame-like bonding layer 404. In addition, the bonding layer 407 preferably has a higher refractive index than the frame-like bonding layer 404. Furthermore, the volume of the bonding layer 407 is preferably less reduced by curing than that of the frame-like bonding layer 404.

The light-emitting device described as Structure Example 1 can be fabricated with a high yield by using the aforementioned separation method. In the separation method described above, the insulating layer 424 and the transistors are formed as a layer to be separated over a formation substrate, so that the insulating layer 424 and the transistors can be formed at 500° C. or lower. By using the insulating layer 424 and the transistors that are formed at 500° C. or lower, a highly reliable light-emitting device can be achieved. Note that the organic EL element 450 or the like may be further formed as a layer to be separated.

Structure Example 2

FIG. 6(A2) is a plan view of a light-emitting device, and FIG. 6(C) is a cross-sectional view taken along the dashed-dotted line X4-Y4 in FIG. 6(A2). The light-emitting device shown in FIG. 6(C) is a bottom-emission light-emitting device using a color filter method.

The light-emitting device shown in FIG. 6(C) includes the flexible substrate 420, the adhesive layer 422, the insulating layer 424, a transistor 454, the transistor 455, the insulating layer 463, a coloring layer 432, the insulating layer 465, a conductive layer 435, an insulating layer 467, the insulating layer 405, the organic EL element 450 (the first electrode 401, the EL layer 402, and the second electrode 403), the bonding layer 407, the flexible substrate 428, and the conductive layer 457. The flexible substrate 420, the adhesive layer 422, the insulating layer 424, the insulating layer 463, the insulating layer 465, the insulating layer 467, and the first electrode 401 transmit visible light.

In the light-emitting portion 491 of the light-emitting device in FIG. 6(C), the switching transistor 454, the current control transistor 455, and the organic EL element 450 are provided over the flexible substrate 420 with the adhesive layer 422 and the insulating layer 424 therebetween. The organic EL element 450 includes the first electrode 401 over the insulating layer 467, the EL layer 402 over the first electrode 401, and the second electrode 403 over the EL layer 402. The first electrode 401 is electrically connected to a source electrode or a drain electrode of the transistor 455 through the conductive layer 435. An end portion of the first electrode 401 is covered with the insulating layer 405. The second electrode 403 preferably reflects visible light. Moreover, the light-emitting device includes, over the insulating layer 463, the coloring layer 432 which overlaps with the organic EL element 450.

The driver circuit portion 493 includes a plurality of transistors. FIG. 6(C) shows two of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described. Furthermore, here, an example in which the conductive layer 457 is formed using the same material and step as those of the conductive layer 435 is described.

The insulating layer 463 has an effect of suppressing diffusion of impurities into a semiconductor included in the transistor. As the insulating layer 465 and the insulating layer 467, an insulating layer having a planarization function is preferably selected in order to reduce surface unevenness due to the transistor and the wirings.

Figure 7A:
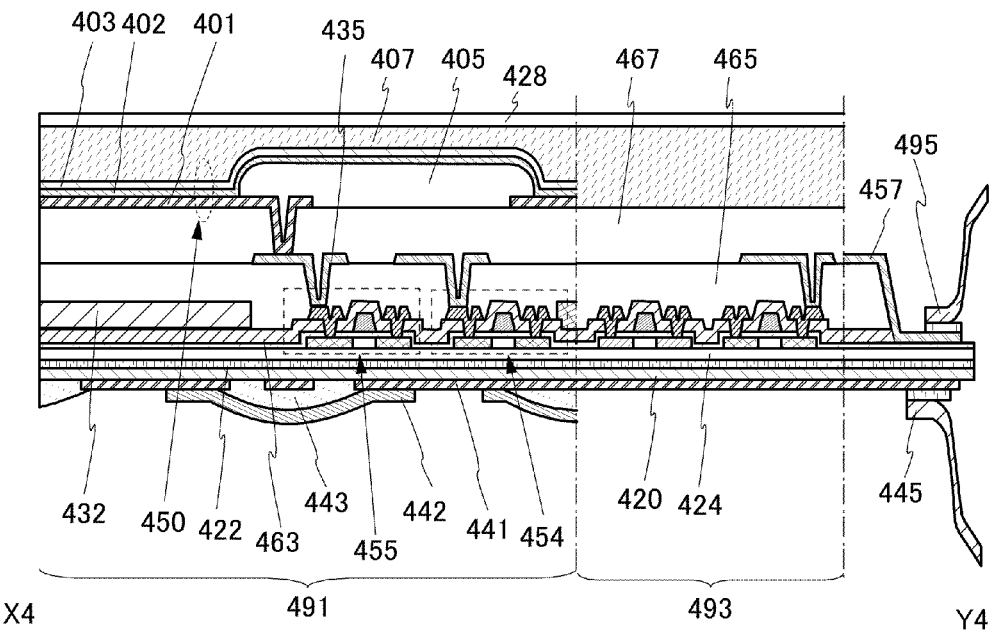
FIG. 7 Views showing an example of a light-emitting device.
Figure 7B:
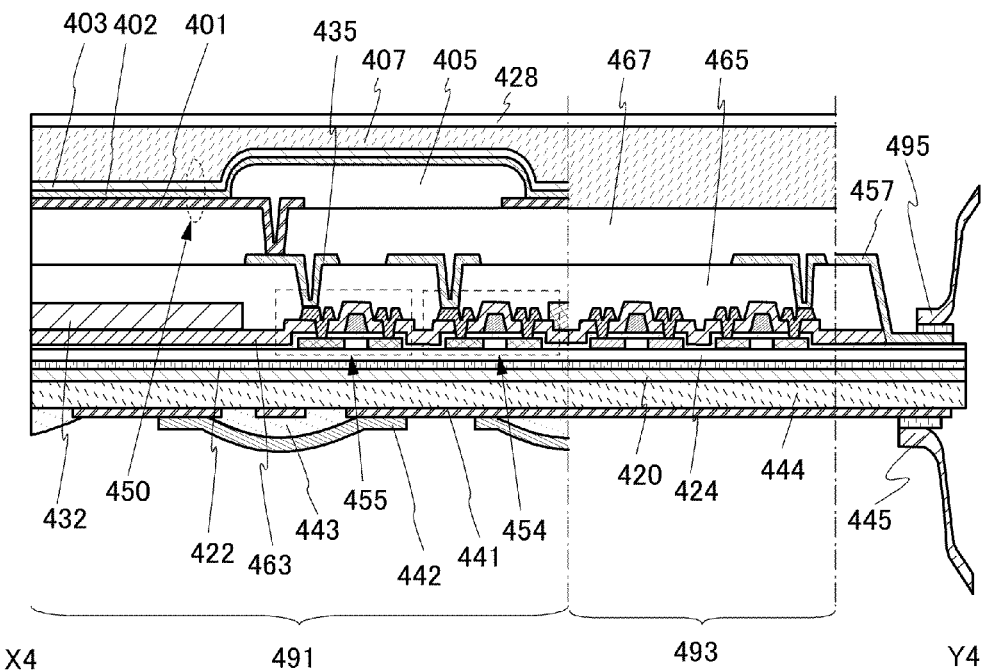

Note that a touch sensor may be provided to overlap with the flexible substrate 420 as shown in FIG. 7(A). The touch sensor includes a conductive layer 441, a conductive layer 442, and an insulating layer 443. As shown in FIG. 7(B), a flexible substrate 444 may be provided between the flexible substrate 420 and the touch sensor. Note that the touch sensor may be provided between the flexible substrate 420 and the flexible substrate 444. An FPC 445 for the touch sensor may also be provided.

The light-emitting device described as Structure Example 2 can be fabricated with a high yield by using the aforementioned separation method. In the separation method described above, the insulating layer 424 and the transistors are formed as a layer to be separated over a formation substrate, so that the insulating layer 424 and the transistors can be formed at 500° C. or lower. By using the insulating layer 424 and the transistors that are formed at 500° C. or lower, a highly reliable light-emitting device can be achieved. Note that the organic EL element 450 or the like may be further formed as a layer to be separated.

Structure Example 3

FIG. 8(A1) is a plan view of a light-emitting device, and FIG. 8(B) is a cross-sectional view taken along the dashed-dotted line X5-Y5 in FIG. 8(A1). The light-emitting device shown in FIG. 8(A1) is a top-emission light-emitting device using a color filter method.

The light-emitting device shown in FIG. 8(B) includes the flexible substrate 420, the adhesive layer 422, the insulating layer 424, the transistor 455, the insulating layer 463, the insulating layer 465, the insulating layer 405, a spacer 496, the organic EL element 450 (the first electrode 401, the EL layer 402, and the second electrode 403), the bonding layer 407, an overcoat 453, a light-blocking layer 431, the coloring layer 432, an insulating layer 226, an adhesive layer 426, the flexible substrate 428, and a conductive layer 457. The flexible substrate 428, the adhesive layer 426, the insulating layer 226, the bonding layer 407, the overcoat 453, and the second electrode 403 transmit visible light.

In the light-emitting portion 491 of the light-emitting device in FIG. 8(B), the transistor 455 and the organic EL element 450 are provided over the flexible substrate 420 with the adhesive layer 422 and the insulating layer 424 therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. The end portion of the first electrode 401 is covered with the insulating layer 405. The first electrode 401 preferably reflects visible light. The spacer 496 is provided over the insulating layer 405. The spacer 496 can adjust the gap between the flexible substrate 420 and the flexible substrate 428.

In addition, the light-emitting device includes the coloring layer 432 that overlaps with the organic EL element 450 with the bonding layer 407 therebetween, and the light-blocking layer 431 that overlaps with the insulating layer 405 with the bonding layer 407 therebetween.

The driver circuit portion 493 includes a plurality of transistors. FIG. 8(B) shows one of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described. Furthermore, here, an example in which the conductive layer 457 is formed using the same material and step as those of the electrodes included in the transistor 455 is described.

In the light-emitting device shown in FIG. 8(B), the FPC 495 overlaps with the flexible substrate 428. The connector 497 is connected to the conductive layer 457 through an opening in the flexible substrate 428, the adhesive layer 426, the insulating layer 226, the bonding layer 407, the insulating layer 465, and the insulating layer 463. Moreover, the connector 497 is connected to the FPC 495. The FPC 495 and the conductive layer 457 are electrically connected to each other through the connector 497. In the case where the conductive layer 457 and the flexible substrate 428 overlap with each other, the conductive layer 457, the connector 497, and the FPC 495 can be electrically connected to one another by forming an opening in the flexible substrate 428 (or using a flexible substrate having an opening).

The insulating layer 424 preferably has an excellent gas barrier property to prevent entry of moisture and oxygen from the flexible substrate 420 side into the light-emitting device. Similarly, the insulating layer 226 preferably has an excellent gas barrier property to prevent entry of moisture and oxygen from the flexible substrate 428 side into the light-emitting device.

The light-emitting device described as Structure Example 3 can be fabricated with a high yield by using the aforementioned separation method. In the separation method described above, the insulating layer 424, the transistors, the organic EL element 450, and the like are formed as a layer to be separated over a formation substrate, and over another formation substrate, the insulating layer 226, the coloring layer 432, the light-blocking layer 431, and the like are formed as a layer to be separated. After the two formation substrates are attached to each other, the layer to be separated and the formation substrate are detached from each other and the layer to be separated and a flexible substrate are attached to each other with the adhesive layer, so that the light-emitting device described as Structure Example 3 can be fabricated.

In the separation method of one embodiment of the present invention, the insulating layers and the transistors can be formed over the formation substrate at 500° C. or lower. By using the insulating layer 424, the insulating layer 226, and the transistors that are formed at 500° C. or lower, a highly reliable light-emitting device can be achieved. The insulating layers (the insulating layer 226 and the insulating layer 424) having high gas barrier properties, which are formed at 500° C. or lower, can be positioned above and below the organic EL element 450. This can prevent entry of impurities such as moisture into the organic EL element 450.

Structure Example 4

FIG. 8(A2) is a plan view of a light-emitting device, and FIG. 8(C) is a cross-sectional view taken along the dashed-dotted line X6-Y6 in FIG. 8(A2). The light-emitting device shown in FIG. 8(A2) is a top-emission light-emitting device using a color filter method.

The light-emitting device shown in FIG. 8(C) includes the flexible substrate 420, the adhesive layer 422, the insulating layer 424, the transistor 455, the insulating layer 463, the insulating layer 465, the insulating layer 405, the organic EL element 450 (the first electrode 401, the EL layer 402, and the second electrode 403), a frame-like bonding layer 404a, a frame-like bonding layer 404b, the bonding layer 407, the overcoat 453, the light-blocking layer 431, the coloring layer 432, the insulating layer 226, the adhesive layer 426, the flexible substrate 428, and the conductive layer 457. The flexible substrate 428, the adhesive layer 426, the insulating layer 226, the bonding layer 407, the overcoat 453, and the second electrode 403 transmit visible light.

In the light-emitting portion 491 of the light-emitting device in FIG. 8C, the transistor 455 and the organic EL element 450 are provided over the flexible substrate 420 with the adhesive layer 422 and the insulating layer 424 therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. The end portion of the first electrode 401 is covered with the insulating layer 405. The first electrode 401 preferably reflects visible light. Moreover, the light-emitting device includes the coloring layer 432 that overlaps with the organic EL element 450 with the bonding layer 407 therebetween, and the light-blocking layer 431 that overlaps with the insulating layer 405 with the bonding layer 407 therebetween.

The driver circuit portion 493 includes a plurality of transistors. FIG. 8(C) shows one of the transistors in the driver circuit portion 493. This embodiment shows an example in which the driver circuit portion 493 is positioned inside the frame-like bonding layers 404a and 404b; however, the driver circuit portion 493 may be positioned outside one or both of the frame-like bonding layers 404a and 404b.

The conductive layer 457 is electrically connected to an external input terminal through which a signal or a potential from the outside is transmitted to the driver circuit portion 493. Here, an example in which the FPC 495 is provided as the external input terminal is described. Furthermore, here, an example in which the conductive layer 457 is formed using the same material and step as those of the electrodes included in the transistor 455 is described. As shown in FIG. 8(C), the FPC 495 and the flexible substrate 428 do not necessarily overlap with each other. The connector 497 is connected to the conductive layer 457. In addition, the connector 497 is connected to the FPC 495. The FPC 495 and the conductive layer 457 are electrically connected to each other through the connector 497.

The conductive layer 457 is preferably positioned outside the frame-like bonding layer 404a, in which case entry of impurities such as moisture into the organic EL element 450 can be prevented even in the case where moisture and the like easily enter a connection portion between the FPC 495 and the connector 497 and a connection portion between the connector 497 and the conductive layer 457.

FIG. 8(C) is different from FIG. 8(B) in that the insulating layer 465 is not exposed in a side surface of the light-emitting device. In the case of using an organic insulating material or the like having a poor gas barrier property as a material for the insulating layer 465, preferably, the insulating layer 465 is not exposed in the side surface of the light-emitting device. The frame-like bonding layer having an excellent gas barrier property is preferably positioned at the side surface of the light-emitting device to increase the reliability of the light-emitting device. Note that the insulating layer 465 may be exposed in an end portion of the light-emitting device as shown in FIG. 8(B) depending on the material or the like for the insulating layer 465.

The frame-like bonding layers 404*a* and 404*b* each preferably have a more excellent gas barrier property than the bonding layer 407 to prevent entry of moisture and oxygen into the light-emitting device through the side surface of the light-emitting device. Thus, a highly reliable light-emitting device can be achieved.

For example, in the case where the frame-like bonding layer 404*a* has a lower water vapor transmission rate than the bonding layer 407 and the frame-like bonding layer 404*b* and a drying agent or the like that adsorbs moisture is included in the frame-like bonding layer 404*b*, entry of moisture can be prevented by the frame-like bonding layer 404*a* and moisture passing through the frame-like bonding layer 404*a* is adsorbed by the frame-like bonding layer 404*b*. This can particularly prevent entry of moisture into the bonding layer 407 and further the organic EL element 450.

In Structure Example 4, light emitted from the organic EL element 450 is extracted from the light-emitting device through the bonding layer 407. For this reason, the bonding layer 407 preferably has a higher light-transmitting property than the frame-like bonding layer 404*a* and the frame-like bonding layer 404*b*. In addition, the bonding layer 407 preferably has a higher refractive index than the frame-like bonding layer 404*a* and the frame-like bonding layer 404*b*. Furthermore, the volume of the bonding layer 407 is preferably less reduced by curing than that of the frame-like bonding layer 404*a* and the frame-like bonding layer 404*b*.

The light-emitting device described as Structure Example 4 can be fabricated with a high yield by using the aforementioned separation method. In the separation method described above, the insulating layer 424, the transistors, the organic EL element 450, and the like are formed as a layer to be separated over a formation substrate, and over another formation substrate, the insulating layer 226, the coloring layer 432, the light-blocking layer 431, and the like are formed as a layer to be separated. After the two formation substrates are attached to each other, the layer to be separated and the formation substrate are detached from each other and the layer to be separated and a flexible substrate are attached to each other with the adhesive layer, so that the light-emitting device described as Structure Example 4 can be fabricated.

In the aforementioned separation method, the insulating layers and the transistors can be formed over the formation substrate at 500° C. or lower. By using the insulating layer 424, the insulating layer 226, and the transistors that are formed at 500° C. or lower, a highly reliable light-emitting device can be achieved. The insulating layers (the insulating layer 226 and the insulating layer 424) having high gas barrier properties, which are formed at 500° C. or lower, can be positioned above and below the organic EL element 450. This can prevent entry of impurities such as moisture into the organic EL element 450.

As described above, in Structure Example 4, the insulating layer 424, the insulating layer 226, and the frame-like bonding layers 404*a* and 404*b* can prevent entry of impurities such as moisture into the organic EL element 450 through a surface (a display surface) of the light-emitting device, a rear surface (a surface facing the display surface) thereof, and a side surface thereof. Thus, a highly reliable light-emitting device can be achieved.

Note that in one embodiment of the present invention, an active matrix method in which an active element (non-linear element) is included in a pixel or a passive matrix method in which an active element is not included in a pixel can be used.

In an active matrix method, as an active element, not only a transistor but also various active elements can be used. For example, a metal insulator metal (MIM), a thin film diode (TFD), or the like can also be used. Since these elements can be formed with a smaller number of fabrication steps, fabrication cost can be reduced or yield can be improved. Furthermore, since the size of these elements is small, the aperture ratio can be improved, so that power consumption can be reduced or higher luminance can be achieved.

Since an active element is not used in a passive matrix method, the number of fabrication steps is small, so that the fabrication cost can be reduced or the yield can be improved. Furthermore, since an active element is not used, the aperture ratio can be improved, so that power consumption can be reduced or higher luminance can be achieved, for example.

Examples of a semiconductor layer used for a transistor include a polysilicon film and a microcrystalline silicon film.

Note that the manufacturing method of the layer to be separated 205 including the transistor has been described in Embodiment 1 and therefore is omitted here.

This embodiment can be implemented in appropriate combination with the other embodiments and example described in this specification.

Embodiment 4

In this embodiment, an example in which a protective film and the like is deposited on the surface of the member of the aforementioned device by an aerosol deposition method is described below.

The aerosol deposition (AD) method is a deposition method without heating a substrate. The aerosol means fine particles dispersed in a gas.

Figure 9A:
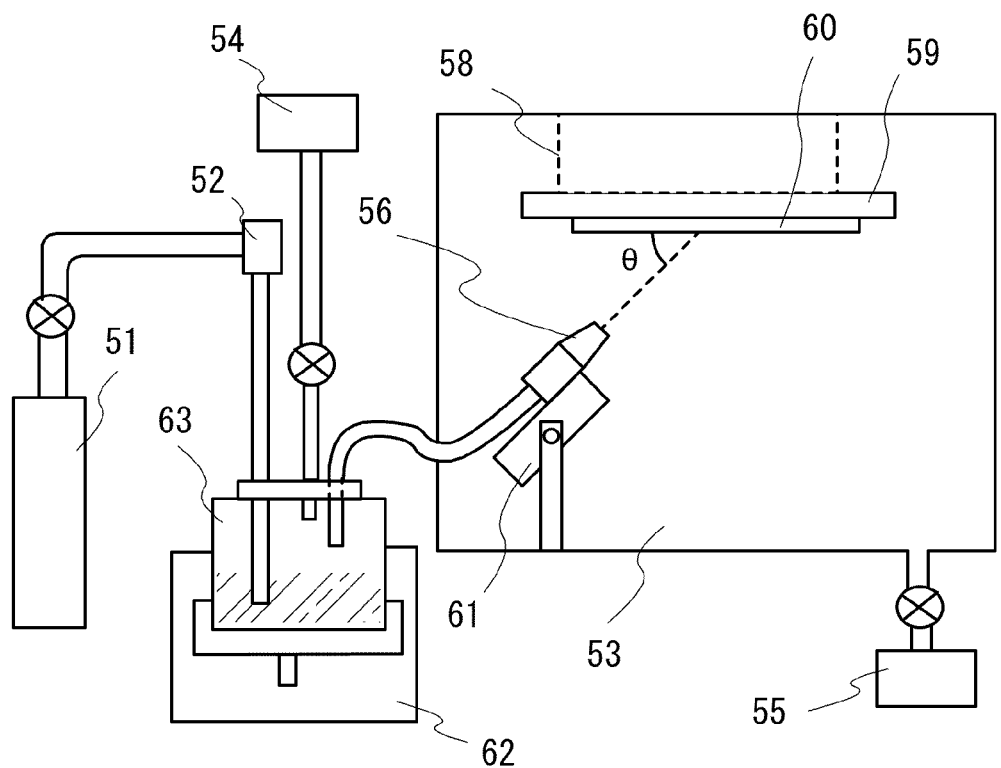
FIG. 9 (A) is a cross-sectional view of a device showing one embodiment of the present invention, and (B) is a perspective view of a nozzle.

FIG. 9(A) shows an example of a cross-sectional structure of a deposition apparatus for aerosol deposition.

The deposition apparatus includes at least a chamber 53, a stage 59 for holding a subject where a film is deposited (e.g., a substrate 60), an evacuation unit 55 such as a pump (a mechanical booster pump, a rotary pump, or the like) for evacuating the chamber 53, a spray unit (e.g., a nozzle 56), a material container 63 provided for the spray unit via a supply line, a gas line for introducing a carrier gas, and a gas tank 51.

First, vibration (e.g., ultrasonic wave) is applied by a vibrator 62 to material powder in the material container 63, and heating is performed to remove moisture in the material container 63. The moisture is evacuated by an evacuation unit 54 via an evacuation line.

Then, a carrier gas is introduced into the material container 63 via the gas line to aerosolize the material powder.

As the carrier gas, dry air, oxygen, or inert gas (e.g., nitrogen, helium gas, or argon gas) is used, and the flow rate of the carrier gas can be adjusted with a flowmeter 52.

In the chamber 53 whose pressure is reduced by the evacuation unit 55, aerosol containing inorganic fine particles (50 nm to 500 nm) is sprayed from the nozzle 56 so that the fine particles collide with the substrate 60 to solidify aerosol, whereby an inorganic material layer can be formed on the surface of the substrate 60. This deposition method is referred to as an AD method. The positions of the subject (e.g., the substrate 60) and the nozzle 56 are appropriately adjusted so that aerosol sprayed from the nozzle 56 collides with the subject (e.g., the substrate 60) at a predetermined incident angle θ (θ=0° to 90°). As the incident angle is increased, an impact force of fine particles that collide with the surface of the substrate 60 is likely to be large. On the other hand, as the incident angle is decreased, mechanical effect including the impact force of fine particles with respect to the surface of the substrate 60 is decreased. An optimal incident angle θ at which aerosol is sprayed onto the subject (e.g., the substrate 60) may be different depending on a material of fine particles which are used, and it is thus important to adjust the incident angle θ.

In the apparatus of FIG. 9, the incident angle θ is fixed with an angle adjustment unit 61, but without limitation to this example, an apparatus may be configured to fix a nozzle and to adjust the angle of the stage 59.

Figure 9B:
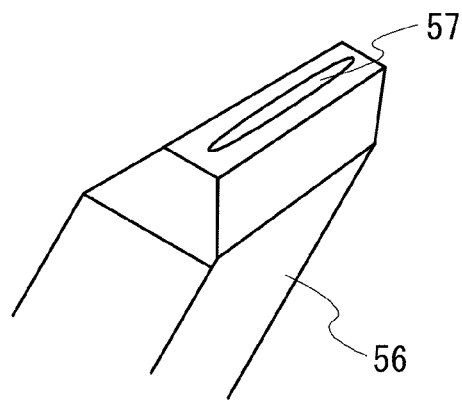

Furthermore, FIG. 9(B) is an enlarged perspective view of a top portion of the nozzle 56. A wide nozzle outlet 57 is shown here, but without limitation to this, a nozzle with a plurality of nozzle outlets may be used.

In addition, selective deposition is also possible by providing a mask including an opening between the nozzle 56 and the substrate 60. Moreover, a wider area can also be deposited by moving the stage 59 in the X direction or the Y direction with a driver device 58 to move the substrate 60 in the X direction or the Y direction accordingly.

Inorganic materials such as aluminum oxide, yttrium oxide, aluminum nitride, silicon carbide, silicon nitride, and titanium oxide can be used as the material of the fine particles for the AD method.

The use of the aerosol deposition (AD) method enables deposition at low temperatures (e.g., at room temperature) on a surface of a resin substrate or an organic material layer. In the aerosol deposition (AD) method, a film grows by repetition of such a phenomenon that fine particles collide on a substrate surface and are plastically deformed, and in some cases are cracked and pressed on the substrate.

In this embodiment, an aluminum oxide film with a thickness of 100 nm to 200 nm is formed on an aramid film used for the display panel by the aerosol deposition method, and is used as a protective film. A film obtained by the aerosol deposition method is dense and fine unevenness is formed on the film surface concurrently with the deposition; thus, a protective film with high adhesion can be achieved.

This embodiment can be implemented in appropriate combination with the other embodiments and example described in this specification.

Embodiment 5

In this embodiment, a separation apparatus of one embodiment of the present invention is described with reference to FIG. 10, FIG. 11, FIG. 12, FIG. 13, FIG. 14, FIG. 15, FIG. 16, and FIG. 17.

One embodiment of the present invention is a separation apparatus including a structure body which can hold a first member of a process member and a stage which can hold a second member of the process member. The first member is wound to detach the first member and the second member of the process member between the structure body and the stage from each other.

With the use of the separation apparatus of one embodiment of the present invention, the first member and the second member of the process member can be detached from each other with a high yield. The separation apparatus of one embodiment of the present invention does not have a complicated structure and can be used for the separation of process members with a variety of sizes.

Examples of the structures and operation of the separation apparatus and separation methods using the separation apparatus are described below.

Structure Example 5

An example of separating a first member 103*a* from a process member 103 so that the first member 103*a* and a second member 103*b* are detached from each other is described with reference to FIG. 10, FIG. 11, and FIG. 12.

Figure 10A:
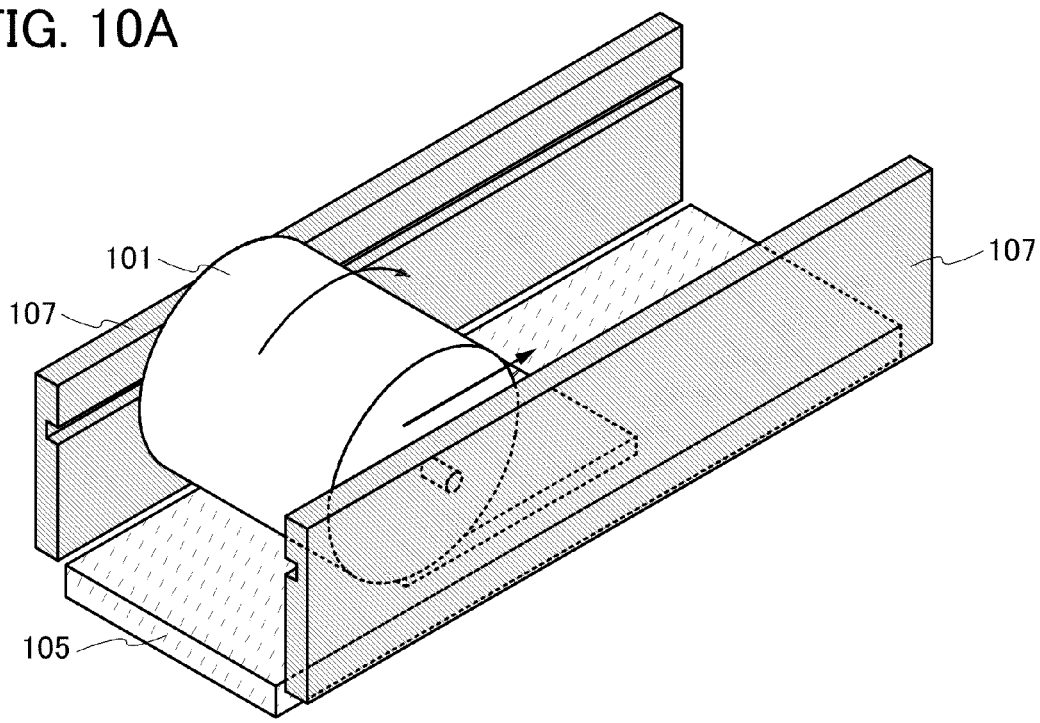
FIG. 10 Views showing an example of a separation apparatus.
Figure 10B:
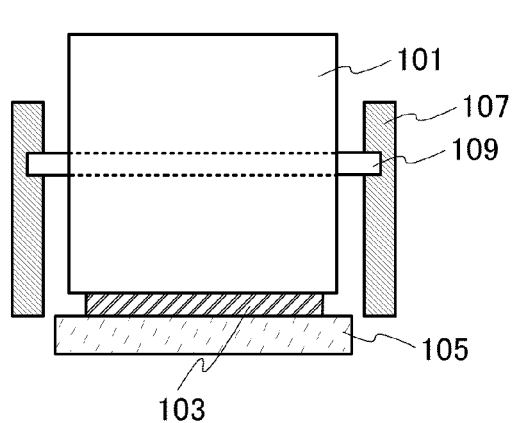
Figure 10C:
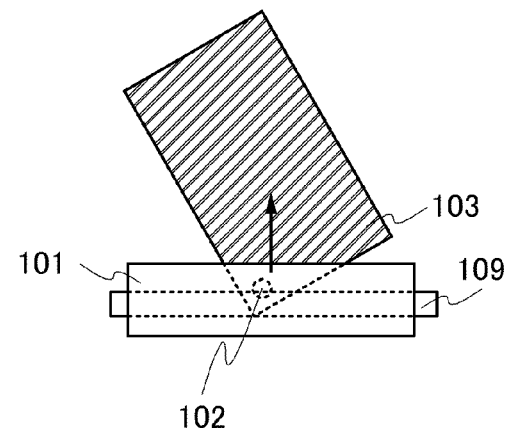
Figure 10D:
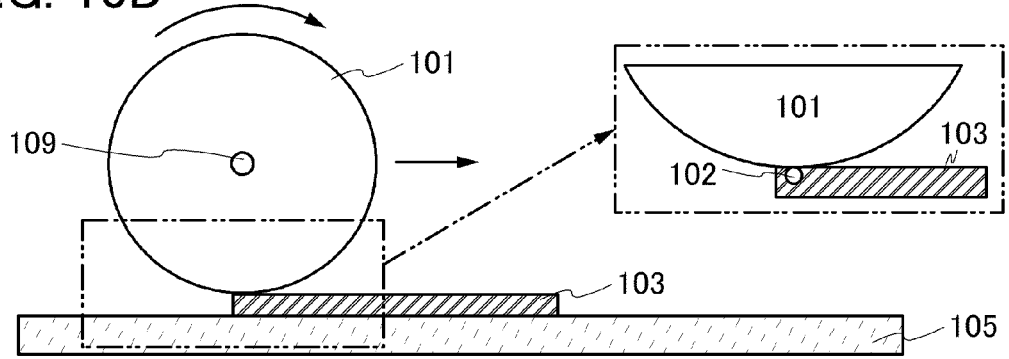

First, a perspective view of a separation apparatus just before separation is shown in FIG. 10(A), a front view is shown in FIG. 10(B), and a side view is shown in FIG. 10(D).

The separation apparatus shown in FIG. 10(A), FIG. 10(B), FIG. 10(C), and FIG. 10(D) includes a structure body 101 and a stage 105. The structure body 101 has a convex surface. The stage 105 has a supporting surface facing the convex surface.

In FIG. 10(A), FIG. 10(B), FIG. 10(C), and FIG. 10(D), the process member 103 is positioned between the convex surface and the supporting surface in the separation apparatus.

FIG. 10(C) is a top view showing the case where the position of the process member 103 with respect to the structure body 101 is different from that in FIGS. 10(A), (B), and (D). FIG. 10(A) shows the case where separation starts from a side portion of the process member 103; alternatively, as shown in FIG. 10(C), the separation may start from a corner portion of the process member 103. In the case where the separation starts from the side portion of the process member 103, the separation is preferably performed from a short side in a long side direction, in which case conditions such as the rotation speed of the structure body can be easily controlled and the yield of the separation can be improved.

The process member 103 has a sheet-like shape and includes the first member 103*a* and the second member 103*b* each having a sheet-like shape. Each of the first member 103*a* and the second member 103*b* may have a single-layer structure or a stacked-layer structure. A separation trigger is preferably formed in the process member 103, in which case separation can be easily performed at the interface between the first member 103*a* and the second member 103*b*.

In the case where the separation apparatus includes a transfer mechanism, the process member 103 may be positioned over the stage 105 by the transfer mechanism.

As shown in an enlarged view of a portion surrounded by dashed-two dotted line in FIG. 10(D), the convex surface of the structure body 101 is positioned so as to overlap with a separation trigger 102, which is formed to have a point-like shape or a linear shape (including a solid line shape, a dashed line shape, and a frame-like shape) in the process member 103. After that, when the structure body 101 rotates, the force of separating the first member 103*a* is applied to the process member 103; thus, the first member 103*a* is separated from the vicinity of the separation trigger 102. Then, the process member 103 is divided into the first member 103*a* and the second member 103*b*.

The structure body 101 can have any shape as long as it has a convex surface and can have, for example, a cylindrical shape (including a columnar shape, a right cylindrical shape, an elliptic cylindrical shape, and a parabolic cylindrical shape), a structure whose part is a cylindrical shape, a spherical shape, a structure whose part is a spherical shape, or the like. For example, a roller such as a drum roller can be used.

Examples of the material for the structure body include a metal, an alloy, an organic resin, or the like. The structure body may have a space or a hollow inside.

Figure 13A:
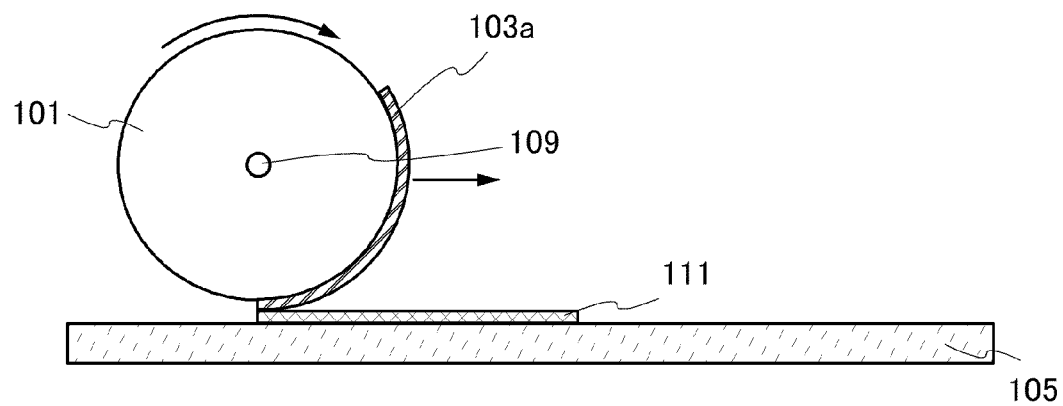
FIG. 13 Views showing an example of a separation apparatus.
Figure 13B:
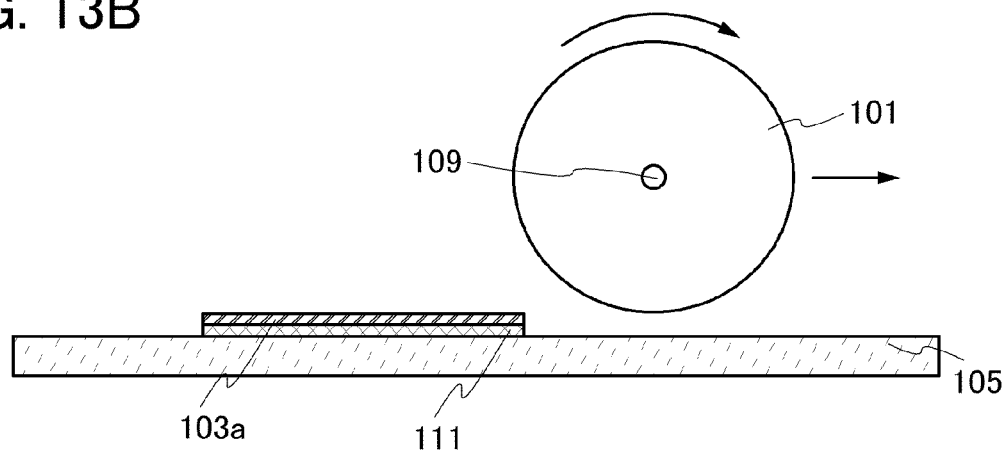
Figure 13C:
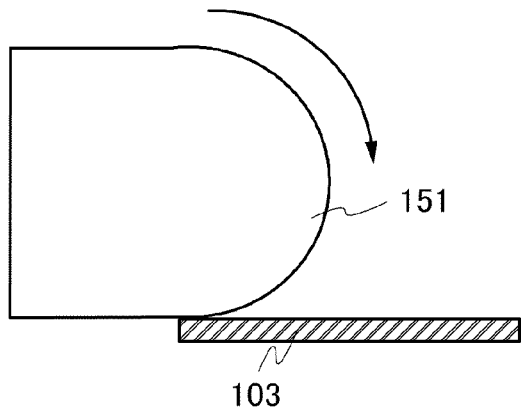
Figure 13D:
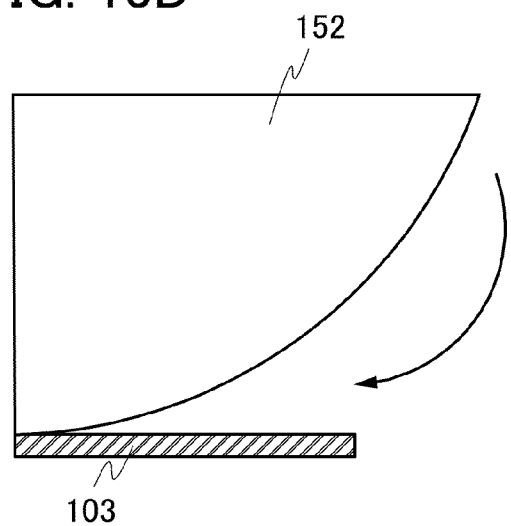

FIGS. 13C and 13D show a structure body 151 and a structure body 152 each of which partly has a convex surface. Each of the structure body 151 and the structure body 152 partly has a cylindrical shape.

The radius of curvature of the convex surface of the structure body is smaller than that of the supporting surface of the stage 105. The radius of curvature of the convex surface can be, for example, greater than or equal to 0.5 mm and less than or equal to 1000 mm. For example, in the case where a film is separated, the radius of curvature of the convex surface may be greater than or equal to 0.5 mm and less than or equal to 500 mm, specifically 150 mm, 225 mm, 300 mm, or the like. Examples of structure bodies having such a convex surface include a roller whose diameter is 300 mm, 450 mm, or 600 mm. Note that the preferable range of the radius of curvature of the convex surface varies with the thickness or size of the process member. Thus, in one embodiment of the present invention, the radius of curvature of the convex surface of the structure body is not limited to the above range as long as the radius of curvature of the convex surface is less than that of the supporting surface of the stage 105.

In the case where the process member 103 includes a stacked-layer structure with low adhesion, separation might occur at an interface with low adhesion, which causes a reduction in the yield of separation. In the case where the process member 103 includes an organic EL element, for example, separation might occur at the interface between two layers in the EL layer or the interface between the EL layer and an electrode, in which case separation does not occur at the interface between the first member 103*a* and the second member 103*b*. Thus, the radius of curvature of the convex surface or the rotation speed of the structure body 101 is set so that separation can occur at the interface between the first member 103*a* and the second member 103*b*.

When the radius of curvature of the convex surface is too small, an element included in the first member 103*a* which is wound along the convex surface might be broken. For this reason, the radius of curvature of the convex surface is preferably greater than or equal to 0.5 mm.

When the radius of curvature of the convex surface is large, a substrate of glass, sapphire, quartz, silicon, or the like, which has low flexibility and high stiffness, can be wound along the convex surface. Thus, the radius of curvature of the convex surface is preferably greater than or equal to 300 mm, for example.

Furthermore, when the radius of curvature of the convex surface is too large, the size of the separation apparatus might be increased, which might limit the installation location. Thus, the radius of curvature of the convex surface is preferably less than or equal to 1000 mm, further preferably less than or equal to 500 mm, for example.

At least part of the convex surface may have viscosity. For example, an adhesive tape or the like may be put on part or the whole of the convex surface. Alternatively, at least part of the convex surface may have adhesion to the first member 103*a*. Further alternatively, the structure body 101 may include a suction mechanism so that the convex surface can be attached to the first member 103*a*.

The structure body 101 or the stage 105 may be movable in at least one of the following directions: forward and backward; right and left; and up and down. The distance between the convex surface of the structure body 101 and the supporting surface of the stage 105 is preferably changeable because process members with a variety of thicknesses can be separated. In Structural Example 5, an example in which the structure body 101 is movable in the longitudinal direction of the stage 105 is described.

Examples of holding mechanisms for holding a member or the like (e.g., the process member 103 or the second member 103*b*) placed over the stage 105 include chucks such as a suction chuck, an electrostatic chuck, and a mechanical chuck. For example, a porous chuck may be used. Alternatively, a member may be fixed to a suction table, a heater table, a spinner table, or the like.

Figure 11A:
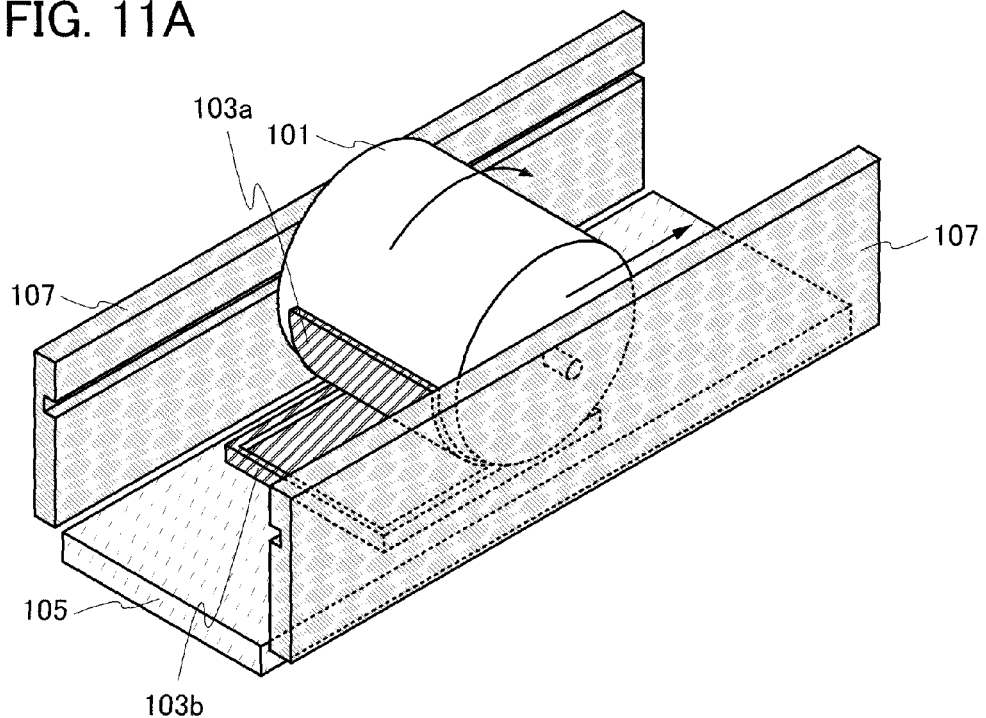
FIG. 11 Views showing an example of a separation apparatus.
Figure 11B:
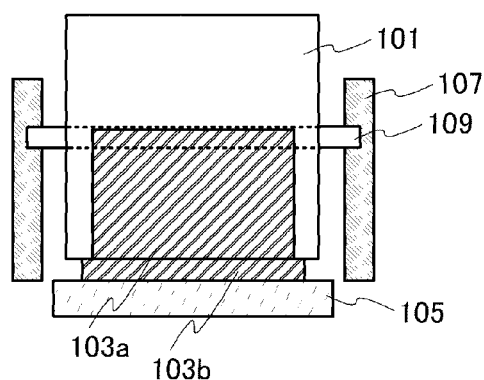
Figure 11C:
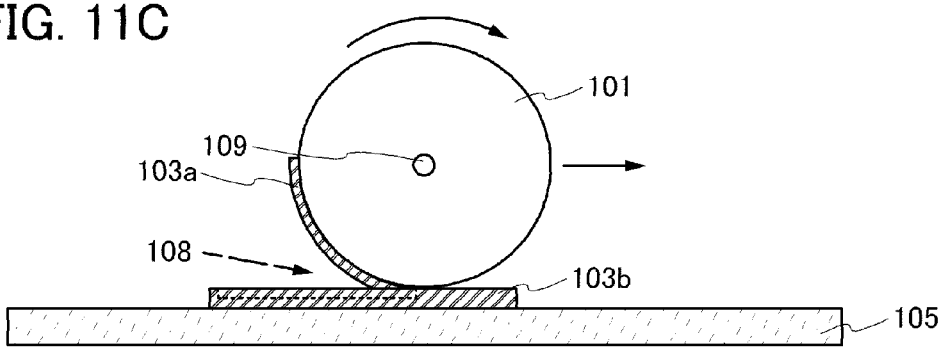
Figure 12A:
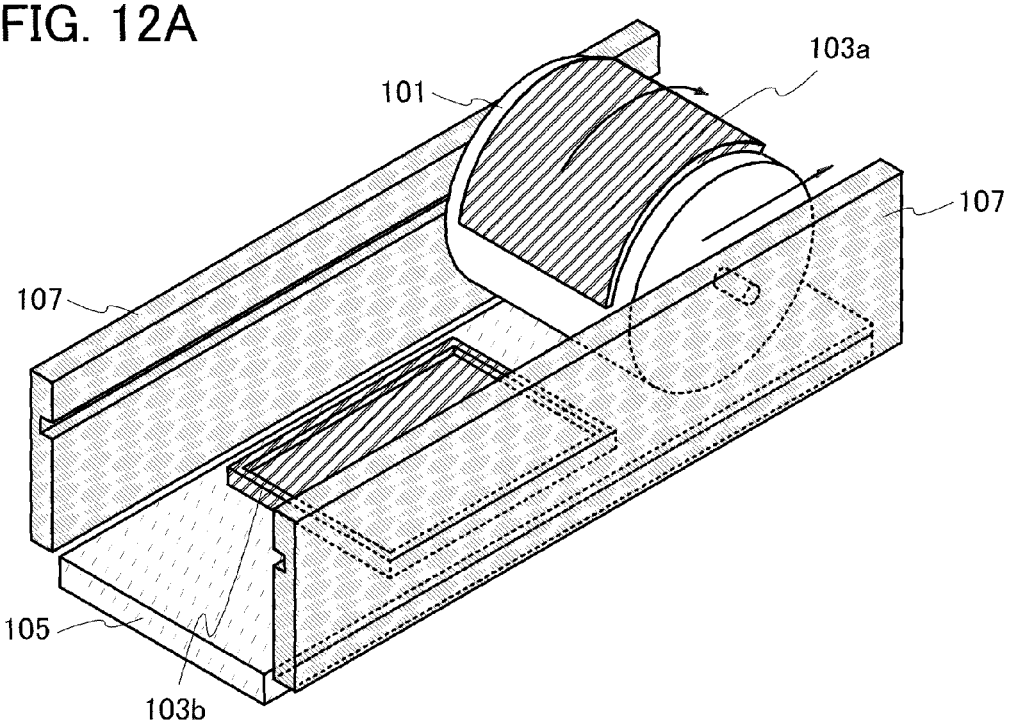
FIG. 12 Views showing an example of a separation apparatus.
Figure 12B:
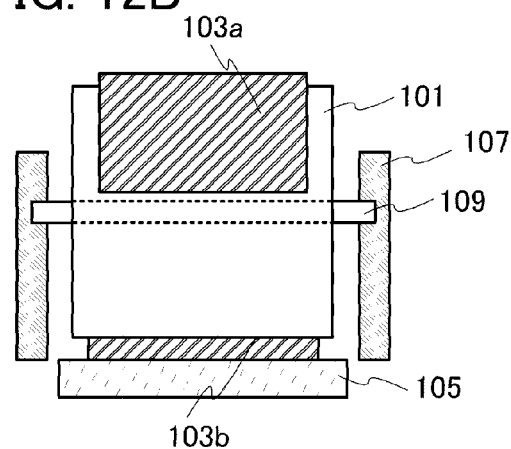
Figure 12C:
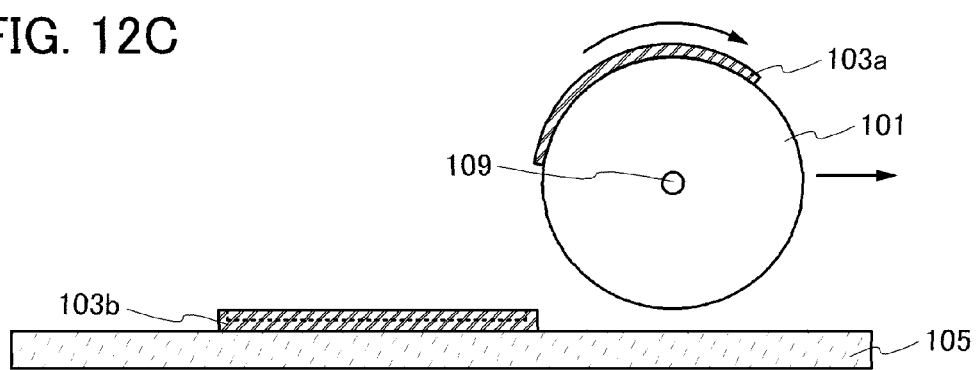

Next, a perspective view of the separation apparatus during the separation is shown in FIG. 11(A), a front view is shown in FIG. 11(B), and a side view is shown in FIG. 11(C). Furthermore, a perspective view of the separation apparatus after the separation is shown in FIG. 12(A), a front view is shown in FIG. 12(B), and a side view is shown in FIG. 12(C).

The structure body 101 includes a rotation axis 109 at the center. FIGS. 11(A), (C), and the like show the rotation direction of the structure body 101; however, the structure body 101 may rotate in the reverse direction. In addition, the rotation axis 109 moves along a groove of a guide 107, whereby the structure body 101 can move in the longitudinal direction of the stage 105 (in the horizontal direction of FIG. 11(C) and FIG. 12(C)).

When the structure body 101 rotates, the first member 103*a* overlapping with the convex surface of the structure body 101 is separated from the process member 103 from the vicinity of the separation trigger and wound along the convex surface to be detached from the second member 103*b*. The first member 103*a* is held by the convex surface of the structure body 101 and the second member 103*b* is held over the stage 105.

In the separation apparatus of one embodiment of the present invention, at least one of the stage 105 and the structure body 101 may move so that the position of the rotation center of the structure body 101 with respect to the stage 105 changes. In Structural Example 5, an example in which the rotation center of the structure body 101 moves is described. Specifically shown is an example in which with the stationary (or fixed) stage 105, the structure body 101 can move (roll) from one end portion side of the process member 103 to the opposite end portion while the first member 103*a* is wound by the structure body 101.

The linear velocity of the convex surface of the structure body 101 is greater than or equal to the speed of the rotation center of the structure body 101 with respect to the stage 105.

The first member 103*a* and the second member 103*b* may be detached from each other while tension is applied to the first member 103*a* or the second member 103*b*.

A liquid feeding mechanism for feeding liquid to the separation surface between the first member 103a and the second member 103b as indicated by an arrow 108 in FIG. 11(C) may be provided.

An adverse effect of static electricity caused at the time of separation on an element or the like included in the first member 103a (e.g., damage to a semiconductor element from static electricity) can be suppressed. Note that a liquid may be sprayed in the form of mist or steam. As the liquid, pure water, an organic solvent, a neutral solution, an alkaline solution, an acid solution, a solution into which salt is dissolved, or the like can be used.

In the case where the separation apparatus includes a transfer mechanism, the second member 103b over the stage 105 and the first member 103a wound by the structure body 101 may be individually transferred by the transfer mechanism after the separation.

Alternatively, as shown in FIGS. 13(A) and (B), the structure body 101 may further rotate so that the first member 103a is bonded to a sheet-like member 111 positioned over the stage 105.

The member 111 may have a single-layer structure or a stacked-layer structure. At least part of a surface of the member 111, which is in contact with the first member 103a, preferably has adhesion to the member 111. For example, an adhesive layer may be provided.

The whole first member 103a may be wound along the convex surface before the structure body 101 finishes rotating one turn. This is preferred because the first member 103a can be prevented from touching the stage 105 and from pressure application by the structure body 101.

It is also preferable that the first member 103a wound along the convex surface be bonded to the member 111 without touching the stage 105.

For example, it is possible that the structure body 101 rotates ¼ turn so that the whole first member 103a is wound along the convex surface, the structure body 101 further rotates ¾ turn to move to the vicinity of an end portion of the member 111, and the structure body 101 further rotates ¼ turn so that the first member 103a is bonded on the member 111.

Alternatively, the distance between the structure body 101 and the stage 105 may be adjusted after the separation so that the first member 103a wound by the structure body 101 does not touch the stage 105.

Structure Example 6

In Structure Example 6, an example in which a stage moves so that the position of the rotation center of a structure body with respect to the stage changes is described. Specifically shown is an example in which the position of the rotation center of the structure body is not moved but the stage can move from one end portion of a process member toward the opposite end portion.

An example of separating a first member 153a from a process member 153 so that the first member 153a and a second member 153b are detached from each other is described with reference to FIG. 14, FIG. 15, and FIG. 16.

Figure 14A:
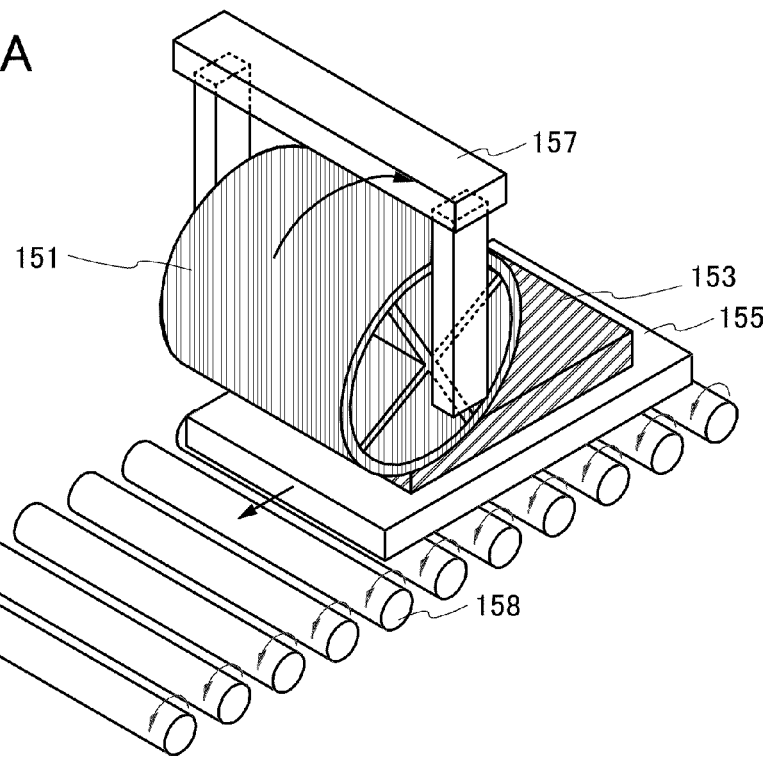
FIG. 14 Views showing an example of a separation apparatus.
Figure 14B:
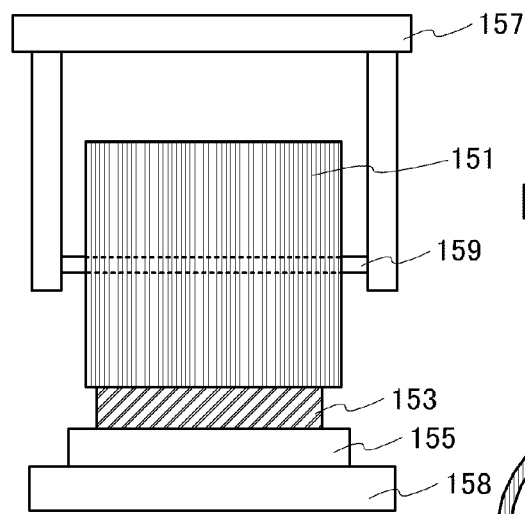
Figure 14C:
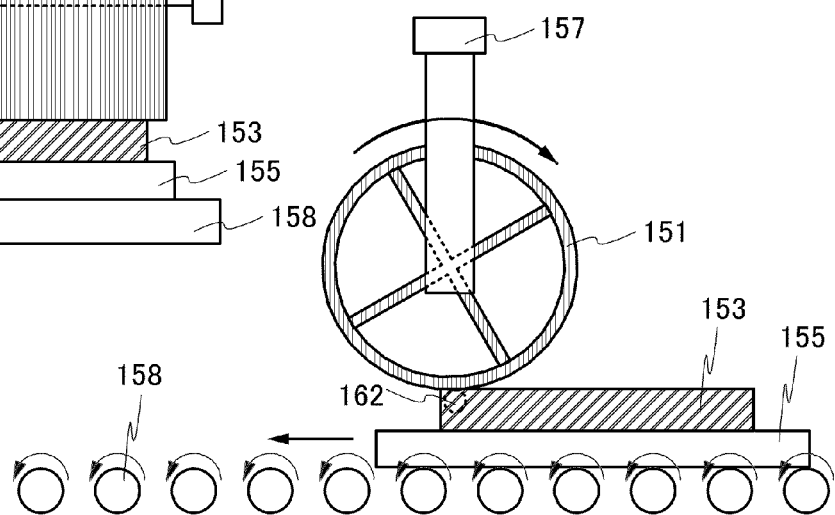

First, a perspective view of a separation apparatus just before separation is shown in FIG. 14(A), a front view is shown in FIG. 14(B), and a side view is shown in FIG. 14(C).

The separation apparatus shown in FIG. 14(A), FIG. 14(B), and FIG. 14(C) includes a structure body 151, a stage 155, a support 157, and a transfer roller 158. The structure body 151 has a convex surface. The stage 155 has a supporting surface facing the convex surface. The support 157 supports the structure body 151.

In FIG. 14(A), FIG. 14(B), and FIG. 14(C), the process member 153 is positioned between the convex surface and the supporting surface in the separation apparatus.

FIG. 14(A) shows the case where separation starts from a side portion of the process member 153; alternatively, as in Structure Example 5, the separation may start from a corner portion of the process member 153.

The structure body 151, the process member 153, and the stage 155 can have structures similar to those of the structure body 101, the process member 103, and the stage 105 in Structure Example 5, respectively; thus, the descriptions are omitted. In the process member 153, a separation trigger 162 is formed.

The support 157 supports a rotation axis 159 of the structure body 151. The support 157 adjusts the vertical position of the structure body 151. Thus, the distance between the convex surface of the structure body 151 and the supporting surface of the stage 155 can be changed.

The transfer rollers 158 can transfer the stage 155. There is no particular limitation on a transfer means of the stage 155, and a conveyor belt or a transfer robot can be used.

In the case where the separation apparatus includes a transfer mechanism, the process member 153 may be positioned over the stage 155 by the transfer mechanism.

Figure 15A:
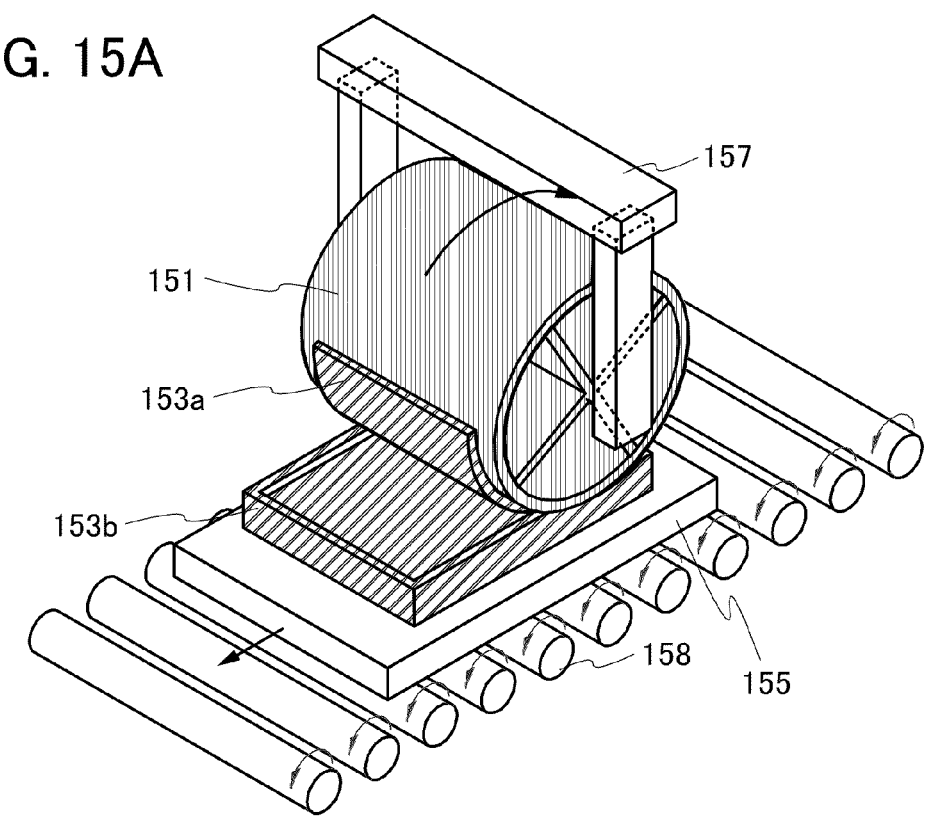
FIG. 15 Views showing an example of a separation apparatus.
Figure 15B:
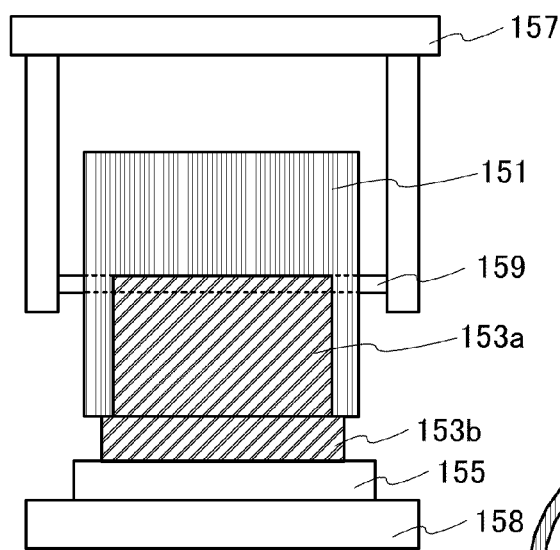
Figure 15C:
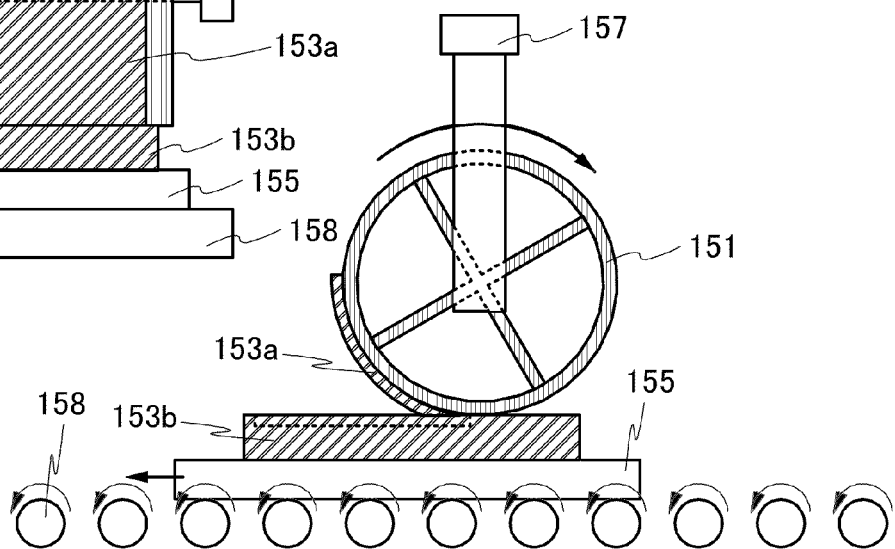
Figure 16A:
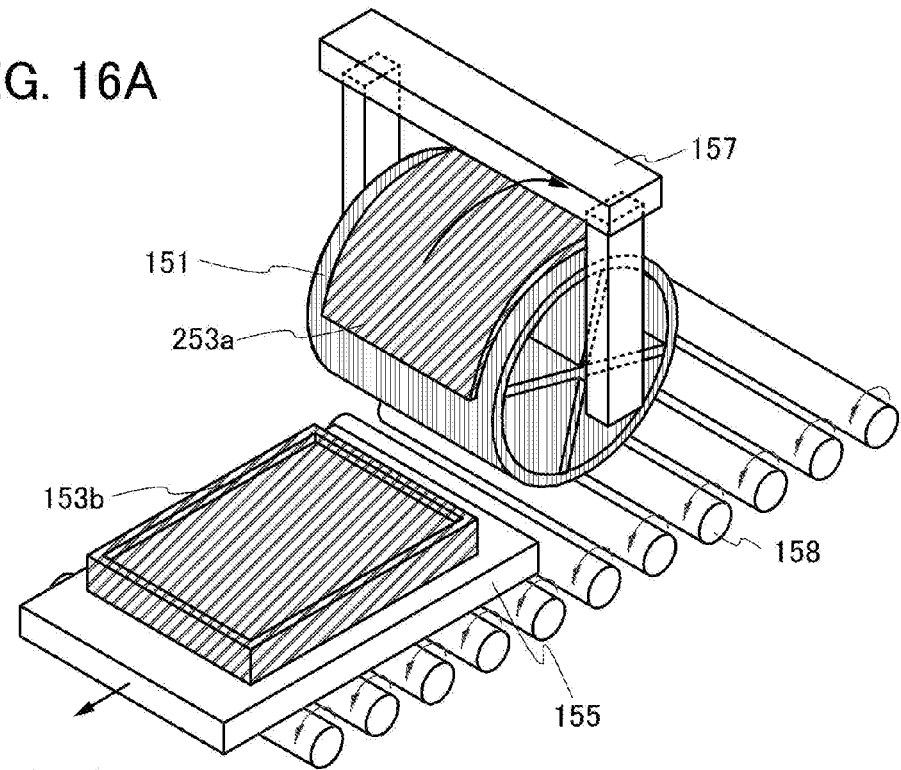
FIG. 16 Views showing an example of a separation apparatus.
Figure 16B:
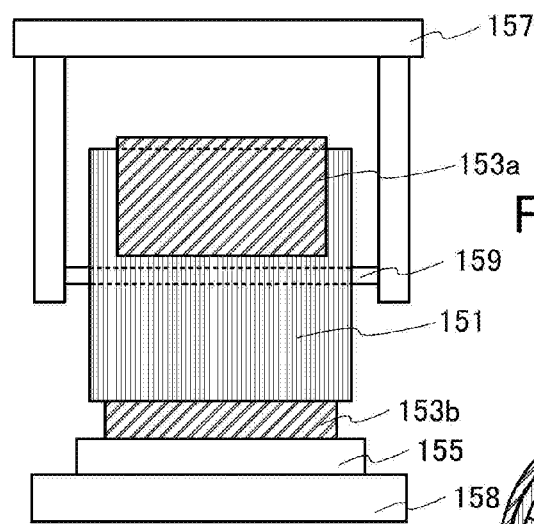
Figure 16C:
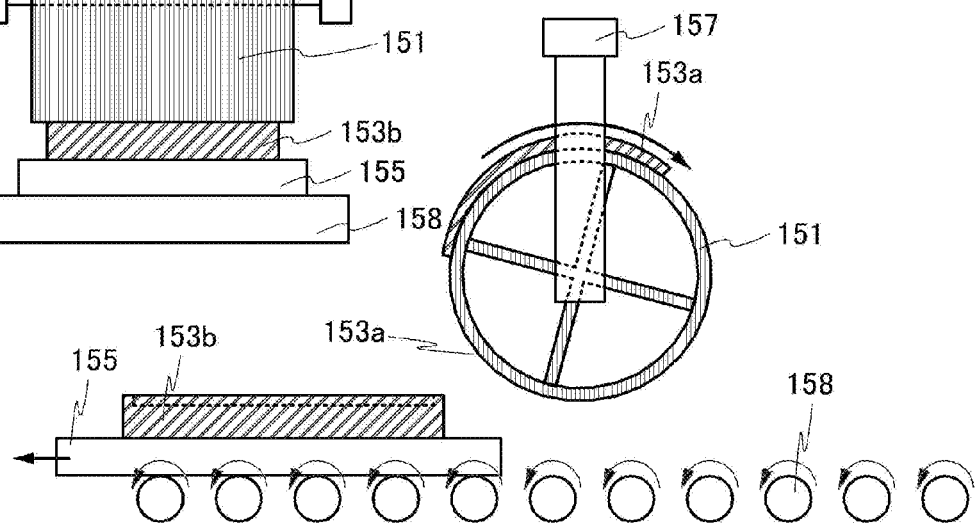

Next, a perspective view of the separation apparatus during the separation is shown in FIG. 15(A), a front view is shown in FIG. 15(B), and a side view is shown in FIG. 15(C). Furthermore, a perspective view of the separation apparatus after the separation is shown in FIG. 16(A), a front view is shown in FIG. 16(B), and a side view is shown in FIG. 16(C).

The structure body 151 includes a rotation axis 159 at the center. FIGS. 15(A), (C), and the like show the rotation directions of the structure body 151 and the transfer rollers 158; however, the structure body 151 and the transfer rollers 158 may each rotate in the reverse direction. The transfer rollers 158 rotate, whereby a positional relation between the rotation center of the structure body 151 and the stage 155 and the process member 153 over the stage 155 can change (specifically, move in the horizontal direction in FIG. 15(C) and FIG. 16(C)).

The first member 153a held by the structure body 151 is separated from the process member 153 and wound along the convex surface to be detached from the second member 153b. The second member 153b is held over the stage 155.

The convex surface of the structure body 151 is positioned so as to overlap with the separation trigger 162 formed in the process member 153. After that, when the structure body 151 rotates, the force of separating the first member 153a is applied to the process member 153; thus, the first member 153a is separated from the vicinity of the separation trigger 162. The first member 153a separated from the process member 103 is wound along the convex surface and detached from the second member 103b. The first member 153a is held by the convex surface of the structure body 151 and the second member 153b is held over the stage 155.

In the case where the separation apparatus includes a transfer mechanism, the second member 153b over the stage 155 and the first member 153a wound by the structure body 151 may be individually transferred by the transfer mechanism after the separation.

Alternatively, as shown in FIGS. 17(A) and (B), the structure body 151 and the transfer rollers 158 may further rotate so that the first member 153a is bonded to a sheet-like member 161 positioned over a stage 156. Note that the member 161 may be positioned over the stage 155 where the process member 153 has been provided.

Structure Example 7

Another structure of the separation apparatus of one embodiment of the present invention is described with reference to FIG. 18. FIG. 18 shows a structure and operation of the separation apparatus of one embodiment of the present invention.

FIG. 18(A-1), FIG. 18(B-1), and FIG. 18(C-1) are schematic views each illustrating a side surface of the separation apparatus of one embodiment of the present invention. FIG. 18(A-2), FIG. 18(B-2), and FIG. 18(C-2) are schematic views each illustrating a top surface.

In addition, FIG. 18(A-1) and FIG. 18(A-2) show the separation apparatus of one embodiment of the present invention in a state where a step of detaching the first member 103a from the process member 103 starts.

FIG. 18(B-1) and FIG. 18(B-2) show the separation apparatus of one embodiment of the present invention in a state where the first member 103a is being detached from the process member 103.

FIG. 18(C-1) and FIG. 18(C-2) show the separation apparatus of one embodiment of the present invention in a state where the separation of the first member 103a from the process member 103 is finished.

Note that the separation apparatus described in Structure Example 7 of this embodiment is different from the separation apparatus described with reference to FIG. 10 to FIG. 17 in including the cylindrical structure body 101 and a rotator 101a that is in contact with an inner wall of the cylindrical structure body 101 and can rotate in synchronization with the rotation of the structure body 101. Different structures are described in detail here, and the above description is referred to for the other similar structures.

The structure body 101 has a cylindrical shape. Note that the structure body 101 may be provided with a member 101b on its outer surface (see FIG. 18(A-1) and FIG. 18(A-2)).

The member 101b can modify the physical properties of the surface of the structure body 101. For example, the member 101b allows the surface of the structure body 101 to have viscosity. Alternatively, the member 101b allows the surface of the structure body 101 to have elasticity that can disperse the stress concentrated on the convex and concave portions.

For example, rubber, silicone rubber, a resin, a natural material, or the like can be used for the member 101b.

Note that in the case where the member 101b provided on the structure body 101 has a joint portion, the process member is provided between the stage 105 and the structure body 101 so as to prevent the process member 103 from being in contact with the joint portion.

The rotator 101a is in contact with the inner periphery of the cylindrical structure body 101, and the process member 103 is sandwiched between the outer periphery of the structure body 101 and the stage 105.

The rotator 101a is provided rotatably around the center axis. For example, the rotator 101a may be provided with a cylindrical roller or a gear on its outer surface.

In the case where the rotator 101a provided with a gear on its outer periphery is used, a gear that meshes the gear of the rotator 101a is provided on an inner surface of the structure body 101. In this structure, for example, the rotator 101a is driven to rotate with use of a driver unit, and the rotation can influence the structure body 101.

In a first step, the process member 103 in which the separation trigger 102 is formed is inserted between the stage 105 and the structure body 101 (see FIG. 18(A-1) and FIG. 18(A-2)). Note that in the case where the process member 103 has a short side and a long side, the separation trigger 102 is preferably provided at a corner portion, and the process member 103 may be inserted from the corner portion in a state of being inclined at a $\theta$ degree angle with respect to the direction perpendicular to the center axis of the rotator 101a. As a result, the first member 103a can be gradually detached from the second member 103b from the separation trigger 102.

In a second step, the detachment of the first member 103a from the second member 103b is made to progress (see FIG. 18(B-1) and FIG. 18(B-2)).

Note that with use of a liquid feeding mechanism, as indicated by the arrow 108, a liquid is supplied to a surface where the first member 103a and the second member 103b are detached (see FIG. 18(B-1)). For example, a liquid is injected to the detachment surface. Alternatively, the liquid may be sprayed.

As the liquid to be injected or sprayed, water, a polar solvent, or the like can be used. By injecting the liquid, an influence of static electricity and the like generated with the separation can be reduced. Alternatively, the separation may be performed while the separation layer is dissolved.

In a third step, the first member 103a and the second member 103b are detached from each other (see FIG. 18(C-1) and FIG. 18(C-2)).

Structure Example 8

Another structure of the separation apparatus of one embodiment of the present invention is described with reference to FIG. 19. FIG. 19 shows a structure and operation of the separation apparatus of one embodiment of the present invention.

FIG. 19(A-1), FIG. 19(B-1), and FIG. 19(C-1) are schematic views each illustrating a side surface of the separation apparatus of one embodiment of the present invention. FIG. 19(A-2), FIG. 19(B-2), and FIG. 19(C-2) are schematic views each illustrating a top surface.

In addition, FIG. 19(A-1) and FIG. 19(A-2) show the separation apparatus of one embodiment of the present invention in a state where a step of detaching the first member 103a from the process member 103 starts.

FIG. 19(B-1) and FIG. 19(B-2) show the separation apparatus of one embodiment of the present invention in a state where the first member 103a is being detached from the process member 103.

FIG. 19(C-1) and FIG. 19(C-2) show the separation apparatus of one embodiment of the present invention in a state where the separation of the first member 103a from the process member 103 is finished.

Note that the separation apparatus described in Structure Example 8 of this embodiment is different from the separation apparatus described with reference to FIG. 14 to FIG. 16 in including the cylindrical structure body 101 instead of the cylindrical structure body 151, and including the rotator 101a that is in contact with an inner wall of the cylindrical structure body 101 and can rotate in synchronization with the rotation of the structure body 101.

Also differently from the separation apparatus described with reference to FIG. 18, the structure body 151 is fixed instead of the structure body 101 and the stage 155 moves.

Note that this embodiment can be combined with the other embodiments in this specification as appropriate.

Embodiment 6

In this embodiment, electronic devices and lighting devices that can be fabricated by employing the separation apparatus of one embodiment of the present invention or the stack manufacturing apparatus of one embodiment of the present invention are described with reference to FIG. 20 and FIG. 21.

A light-emitting device, a display device, a semiconductor device, or the like that can be used for an electronic device or a lighting device can be fabricated with a high yield by employing one embodiment of the present invention. Moreover, a flexible electronic device or lighting device having high productivity can be fabricated by employing one embodiment of the present invention.

Examples of the electronic device include a television set (also referred to as a television or a television receiver), a monitor of a computer or the like, a digital camera, a digital video camera, a digital photo frame, a mobile phone (also referred to as a cellular phone or a mobile phone device), a portable game machine, a portable information terminal, an audio reproducing device, and a large game machine such as a pinball machine.

In addition, the device fabricated by employing one embodiment of the present invention has flexibility and therefore can be incorporated along a curved inside/outside wall surface of a house or a building or a curved interior/exterior surface of a car.

Figure 20A:
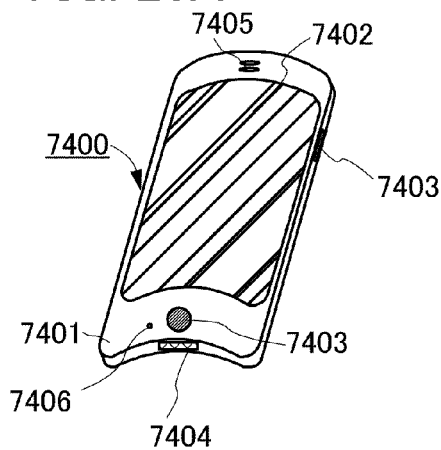
FIG. 20 Views showing examples of an electronic device and a lighting device.

FIG. 20(A) shows an example of a mobile phone. A mobile phone 7400 includes a display portion 7402 incorporated in a housing 7401, operation buttons 7403, an external connection port 7404, a speaker 7405, a microphone 7406, and the like. Note that the mobile phone 7400 is fabricated using the display device fabricated by employing one embodiment of the present invention for the display portion 7402. One embodiment of the present invention enables a highly reliable mobile phone having a curved display portion to be provided with a high yield.

When the display portion 7402 of the mobile phone 7400 shown in FIG. 20(A) is touched with a finger or the like, data can be input into the mobile phone 7400. In addition, operations such as making a call and inputting a letter can be all performed by touch on the display portion 7402 with a finger or the like.

With the operation buttons 7403, the power can be turned on or off, and types of images displayed on the display portion 7402 can be switched, for example, from a mail creation screen to a main menu screen.

Figure 20B:
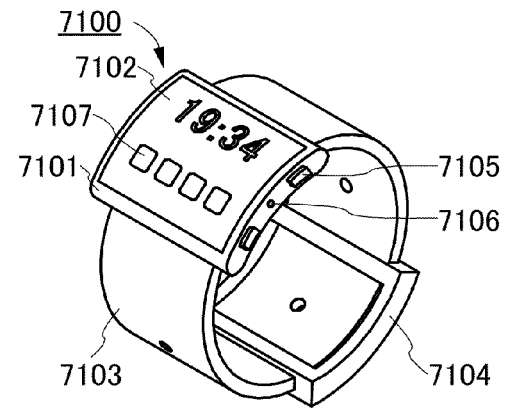

FIG. 20(B) shows an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, on/off of the power, on/off of wireless communication, setting and cancellation of silent mode, and setting and cancellation of power saving mode can be performed. For example, the functions of the operation button 7105 can be set freely by setting the operation system incorporated in the portable information terminal 7100.

The portable information terminal 7100 can execute near field communication that is a communication method based on an existing communication standard. In that case, for example, hands-free calling can be performed by mutual communication with a headset capable of wireless communication.

Moreover, the portable information terminal 7100 includes the input/output terminal 7106, and data can be directly communicated with another information terminal via a connector. Charging through the input/output terminal 7106 is also possible. Note that the charging operation may be performed by wireless power feeding without using the input/output terminal 7106.

The display portion 7102 of the portable information terminal 7100 includes a light-emitting device fabricated by using one embodiment of the present invention. One embodiment of the present invention enables a highly reliable portable information terminal having a curved display portion to be provided with a high yield.

Figure 20C:
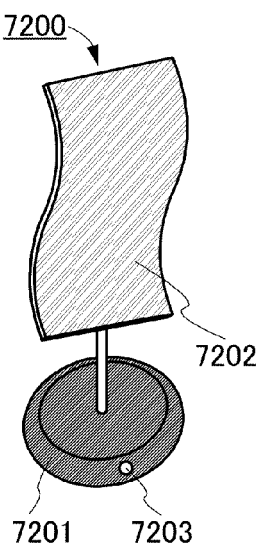
Figure 20D:
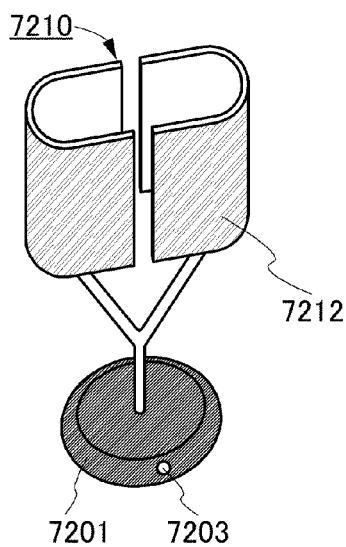
Figure 20E:
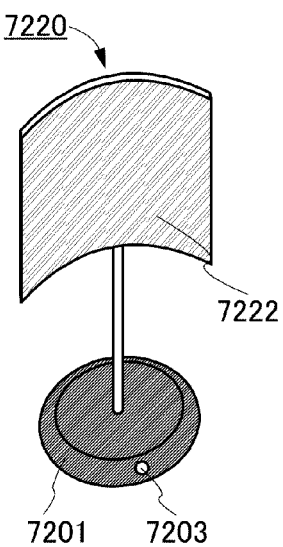

FIG. 20(C), FIG. 20(D), and FIG. 20(E) show examples of a lighting device. A lighting device 7200, a lighting device 7210, and a lighting device 7220 each include a stage 7201 provided with an operation switch 7203 and a light-emitting portion supported by the stage 7201.

The lighting device 7200 shown in FIG. 20(C) includes a light-emitting portion 7202 having a wave-shaped light-emitting surface, and thus has good design.

A light-emitting portion 7212 included in the lighting device 7210 shown in FIG. 20(D) has two convex-curved light-emitting portions symmetrically placed. Thus, light radiates from the lighting device 7210 in all directions.

The lighting device 7220 shown in FIG. 20(E) includes a concave-curved light-emitting portion 7222. This is suitable for illuminating a specific range because light emitted from the light-emitting portion 7222 is collected to the front of the lighting device 7220.

The light-emitting portion included in each of the lighting device 7200, the lighting device 7210, and the lighting device 7220 have flexibility; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device fabricated by employing one embodiment of the present invention. One embodiment of the present invention enables a highly reliable lighting device having a curved display portion to be provided with a high yield.

Figure 20F:
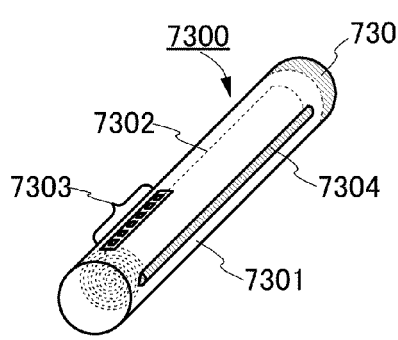

FIG. 20F shows an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

In addition, the display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, on/off of the power, switching of displayed videos, and the like can be performed.

Figure 20G:
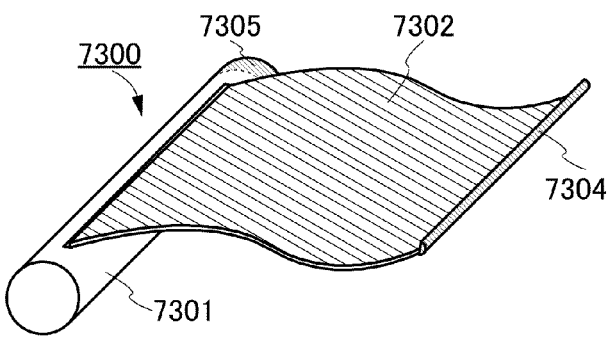

FIG. 20G shows a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as shown in FIG. 20(F), which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device manufactured by employing one embodiment of the present invention. One embodiment of the present invention enables a lightweight and highly reliable display device to be provided with a high yield.

Figure 21A:
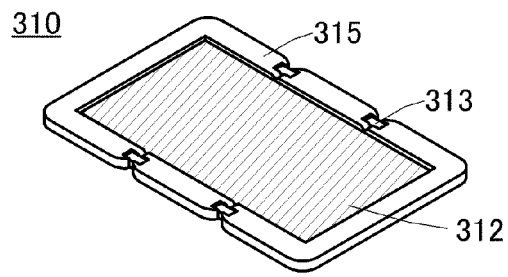
FIG. 21 Views showing examples of an electronic device.
Figure 21B:
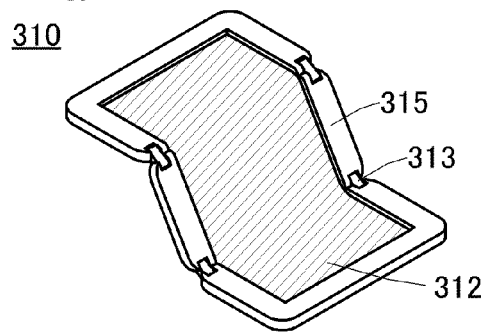
Figure 21C:
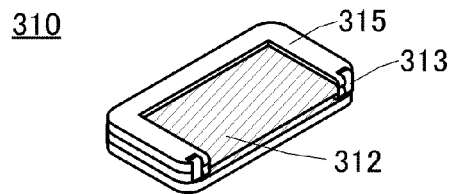

FIG. 21(A), FIG. 21(B), and FIG. 21(C) show a foldable portable information terminal 310. FIG. 21(A) shows the portable information terminal 310 that is opened. FIG. 21(B) shows the portable information terminal 310 that is being opened or being folded. FIG. 21(C) shows the portable information terminal 310 that is folded. The portable information terminal 310 is highly portable when folded. The portable information terminal 310 is highly browsable when opened because of its seamless large display region.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. A display device manufactured by employing one embodiment of the present invention can be used for the display panel 312. For example, a display device that can be bent with a radius of curvature of greater than or equal to 1 mm and less than or equal to 150 mm can be used.

Figure 21D:
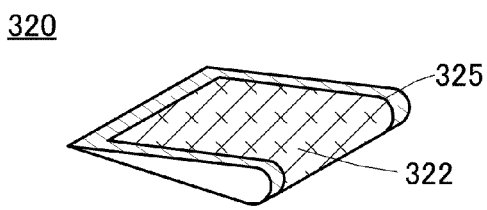
Figure 21E:
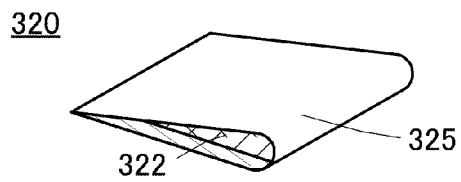

FIGS. 21(D) and (E) each show a foldable portable information terminal 320. FIG. 21(D) shows the portable information terminal 320 that is folded so that a display portion 322 is on the outside. FIG. 21(E) shows the portable information terminal 320 that is folded so that the display portion 322 is on the inside. When not used, the portable information terminal 320 is folded so that a non-display portion 325 faces the outside, whereby the display portion 322 can be prevented from being contaminated or damaged. A display device manufactured by employing one embodiment of the present invention can be used for the display portion 322.

Figure 21F:
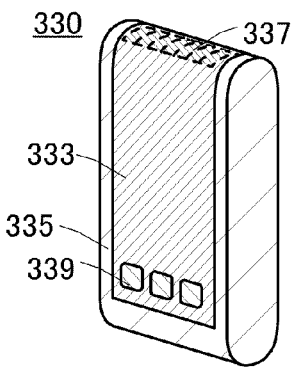
Figure 21G:
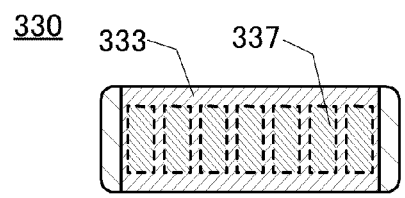
Figure 21H:
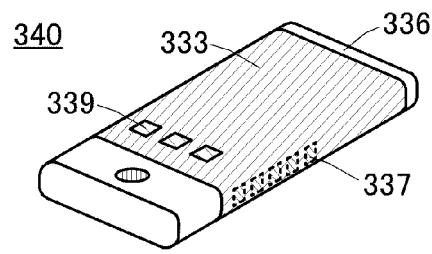

FIG. 21(F) is a perspective view showing an external shape of the portable information terminal 330. FIG. 21(G) is a top view of the portable information terminal 330. FIG. 21(H) is a perspective view showing an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 21(F) and (H)). In addition, information 337 indicated by dashed rectangles can be displayed on another surface (FIGS. 21(G) and (H)). Examples of the information 337 include display indicating reception of an e-mail, a social networking service (SNS), an incoming call, or the like, the title of an e-mail, SNS, or the like, the sender of an e-mail, SNS, or the like, the date, the time, remaining battery, and the reception strength of an antenna. Alternatively, the operation buttons 339, an icon, or the like may be displayed in place of the information 337. Although FIGS. 21(F) and (G) show an example in which the information 337 is displayed at the top, one embodiment of the present invention is not limited thereto. For example, the information may be displayed on the side of the portable information terminal 340 as shown in FIG. 21(H).

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. The user can see the display without taking out the portable information terminal 330 from the pocket and decide whether to answer the call.

A display device manufactured by employing one embodiment of the present invention can be used for a display portion 333 included in each of a housing 335 of the portable information terminal 330 and a housing 336 of the portable information terminal 340. One embodiment of the present invention enables a highly reliable display device having a curved display portion to be provided with a high yield.

Figure 21I:
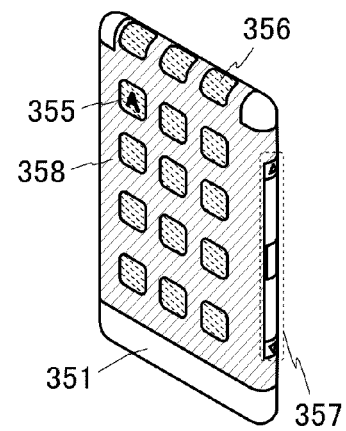

As in a portable information terminal 345 shown in FIG. 21(I), data may also be displayed on three or more surfaces. Here, data 355, data 356, and data 357 are displayed on different surfaces.

For a display portion 358 included in a housing 351 of the portable information terminal 345, a display device manufactured by employing one embodiment of the present invention can be used. One embodiment of the present invention enables a highly reliable display device having a curved display portion to be provided with a high yield.

This embodiment can be combined with the other embodiments as appropriate.

REFERENCE NUMERALS

11: buffer layer 12: moisture-proof film 13: moisture-proof film 14: moisture-proof film 15: moisture-proof film 16: semiconductor layer 17: crystalline semiconductor film 18: gate insulating film 19: conductive layer 20: resist mask 21: high-concentration impurity region 22: source region 23: drain region 24: interlayer insulating film 25: drain electrode 30: n-channel transistor 31: buffer layer 32: back gate 33: back gate 34: n-channel transistor 35: gate electrode 36: gate electrode 37: low-concentration impurity region 39: n-channel transistor 40: p-channel transistor 41: p-channel transistor 42: p-channel transistor 51: gas tank 52: flowmeter 53: chamber 54: evacuation unit 55: evacuation unit 56: nozzle 57: nozzle outlet 58: driver device 59: stage 60: substrate 61: angle adjustment unit 62: vibrator 63: material container 101: structure body 101a: rotator 101b: member 102: separation trigger 103: process member 103a: member 103b: member 105: stage 107: guide 108: arrow 109: rotation axis 111: member 151: structure body 152: structure body 153: process member 153a: member 153b: member 155: stage 156: stage 157: support 158: transfer roller 159: rotation axis 161: member 162: separation trigger 201: formation substrate 203: separation layer 205: layer to be separated 207: bonding layer 211: bonding layer 221: formation substrate 223: separation layer 225: layer to be separated 226: insulating layer 231: substrate 233: bonding layer 311: portable information terminal 312: display panel 313: hinge 315: housing 320: portable information terminal 322: display portion 325: non-display portion 330: portable information terminal 333: display portion 335: housing 336: housing 337: information 339: operation button 340: portable information terminal 345: portable information terminal 351: housing 355: data 356: data 357: data 358: display portion 401: electrode 402: EL layer 403: electrode 404: bonding layer 404a: bonding layer 404b: bonding layer 405: insulating layer 407: bonding layer 420: flexible substrate 422: adhesive layer 424: insulating layer 426: adhesive layer 428: flexible substrate 431: light-blocking layer 432: coloring layer 435: conductive layer 441: conductive layer 442: conductive layer 443: insulating layer 444: flexible substrate 445: FPC 450: organic EL element 453: overcoat 454: transistor 455: transistor 457: conductive layer 463: insulating layer 465: insulating layer 467: insulating layer 491: light-emitting portion 493: driver circuit portion 495: FPC 496: spacer 497: connector 7100: portable information terminal 7101: housing 7102: display portion 7103: band 7104: buckle 7105: operation button 7106: input/output terminal 7107: icon 7200: lighting device 7201: stage 7202: light-emitting portion 7203: operation switch 7210: lighting device 7212: light-emitting portion 7220: lighting device 7222: light-emitting portion 7300: display device 7301: housing 7302: display portion 7303: operation button 7304: display portion pull 7305: control portion 7400: mobile phone 7401: housing 7402: display portion 7403: operation button 7404: external connection port 7405: speaker 7406: microphone

The invention claimed is:

1. A manufacturing method of a semiconductor device comprising:
forming a separation layer over a substrate having an insulating surface;
forming a semiconductor layer containing silicon over the separation layer;
performing light irradiation for crystallization on the semiconductor layer containing silicon;
adding hydrogen and at least one of a p-type impurity element and an n-type impurity element to the semiconductor layer containing silicon and the separation layer;
performing heat treatment for supplying hydrogen to the separation layer; and
detaching the substrate from an interface or inside of the separation layer with use of a roller.

2. The manufacturing method of a semiconductor device according to claim 1, wherein the separation layer is a layer containing tungsten.

3. The manufacturing method of a semiconductor device according to claim 1, further comprising forming a buffer layer containing hydrogen between the substrate and the separation layer.

4. The manufacturing method of a semiconductor device according to claim 1, wherein $N_2O$ plasma treatment is performed after the separation layer is formed.

5. The manufacturing method of a semiconductor device according to claim 1, wherein water is supplied to the interface of the separation layer when the separation layer is detached from the substrate.

6. The manufacturing method of a semiconductor device according to claim 1, wherein the roller is attached to an adhesive tape and is rotated when the separation layer is detached from the substrate.

7. A manufacturing method of a semiconductor device comprising:
forming a separation layer over a substrate having an insulating surface;
forming a buffer layer containing hydrogen over the separation layer;
forming a semiconductor layer containing silicon over the buffer layer containing hydrogen;
performing light irradiation for crystallization on the semiconductor layer containing silicon;
adding hydrogen and at least one of a p-type impurity element and an n-type impurity element to the semiconductor layer containing silicon and the separation layer;
performing heat treatment; and
detaching the substrate from an interface or inside of the separation layer with use of a roller.

8. The manufacturing method of a semiconductor device according to claim 7, wherein the separation layer is a layer containing tungsten.

9. The manufacturing method of a semiconductor device according to claim 7, wherein $N_2O$ plasma treatment is performed after the separation layer is formed.

10. The manufacturing method of a semiconductor device according to claim 7, wherein water is supplied to the interface of the separation layer when the separation layer is detached from the substrate.

11. The manufacturing method of a semiconductor device according to claim 7, wherein the roller is attached to an adhesive tape and is rotated when the separation layer is detached from the substrate.

12. A manufacturing method of a semiconductor device comprising:
forming a separation layer over a substrate having an insulating surface;
forming a semiconductor layer containing silicon over the separation layer;
performing light irradiation for crystallization on the semiconductor layer containing silicon;
adding at least one of a p-type impurity element and an n-type impurity element to the semiconductor layer containing silicon and adding hydrogen to the separation layer;
performing heat treatment; and
detaching the substrate from an interface or inside of the separation layer with use of a roller.

13. The manufacturing method of a semiconductor device according to claim 12, wherein the separation layer is a layer containing tungsten.

14. The manufacturing method of a semiconductor device according to claim 12, wherein $N_2O$ plasma treatment is performed after the separation layer is formed.

15. The manufacturing method of a semiconductor device according to claim 12, wherein water is supplied to the interface of the separation layer when the separation layer is detached from the substrate.

16. The manufacturing method of a semiconductor device according to claim 12, wherein the roller is attached to an adhesive tape and is rotated when the separation layer is detached from the substrate.

* * * * *